(12) United States Patent
Tung

(10) Patent No.: US 7,859,740 B2
(45) Date of Patent: Dec. 28, 2010

(54) STICTION MITIGATION WITH INTEGRATED MECH MICRO-CANTILEVERS THROUGH VERTICAL STRESS GRADIENT CONTROL

(75) Inventor: Yeh-Jiun Tung, Sunnyvale, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 152 days.

(21) Appl. No.: 12/275,366

(22) Filed: Nov. 21, 2008

(65) Prior Publication Data

US 2010/0128337 A1    May 27, 2010

Related U.S. Application Data

(60) Provisional application No. 61/080,005, filed on Jul. 11, 2008.

(51) Int. Cl.
 *G02B 26/00* (2006.01)
(52) U.S. Cl. .......................................... 359/291; 359/290
(58) Field of Classification Search .............. 359/198.1, 359/212.1, 221.2, 224.1, 224.2, 247, 290, 359/291, 292, 302
See application file for complete search history.

(56) References Cited

U.S. PATENT DOCUMENTS

| | | | |
|---|---|---|---|
| 3,247,392 | A | 4/1966 | Thelen |
| 3,728,030 | A | 4/1973 | Hawes |
| 3,955,190 | A | 5/1976 | Teraishi |
| 4,403,248 | A | 9/1983 | te Velde |
| 4,441,789 | A | 4/1984 | Pohlack |
| 4,441,791 | A | 4/1984 | Hornbeck |
| 4,560,435 | A | 12/1985 | Brown et al. |
| 4,655,554 | A | 4/1987 | Armitage |
| 4,786,128 | A | 11/1988 | Birnbach |
| 4,859,060 | A | 8/1989 | Katagiri et al. |
| 4,925,259 | A | 5/1990 | Emmett |
| 4,954,789 | A | 9/1990 | Sampsell |
| 4,956,619 | A | 9/1990 | Hornbeck |

(Continued)

FOREIGN PATENT DOCUMENTS

EP    0 668 490    8/1995

(Continued)

OTHER PUBLICATIONS

Conner, "Hybrid Color Display Using Optical Interference Filter Array," SID Digest, pp. 577-580 (1993).

(Continued)

*Primary Examiner*—William C Choi
(74) *Attorney, Agent, or Firm*—Knobbe, Martens, Olson & Bear LLP

(57) ABSTRACT

The present disclosure relates to the mitigation of stiction in MEMS devices. In some embodiments, a MEMS device may be provided with one or more restoration features that provide an assisting mechanical force for mitigating stiction. The restoration feature may be implemented as one or more deflectable elements, where the deflectable elements may have various configurations or shapes, such as a chevron, cross, and the like. For example, the restoration feature can be a cantilever that deflects when at least one component comes into contact or proximity with another component. Multiple restoration features also may be employed and placed strategically within the MEMS device to maximize their effectiveness in mitigating stiction.

31 Claims, 21 Drawing Sheets

U.S. PATENT DOCUMENTS

| | | |
|---|---|---|
| 4,973,131 A | 11/1990 | Carnes |
| 4,982,184 A | 1/1991 | Kirkwood |
| 5,022,745 A | 6/1991 | Zahowski et al. |
| 5,028,939 A | 7/1991 | Hornbeck et al. |
| 5,062,689 A | 11/1991 | Koehler |
| 5,091,983 A | 2/1992 | Lukosz |
| 5,096,279 A | 3/1992 | Hornbeck et al. |
| 5,170,283 A | 12/1992 | O'Brien et al. |
| 5,315,370 A | 5/1994 | Bulow |
| 5,381,232 A | 1/1995 | Van Wijk |
| 5,452,138 A | 9/1995 | Mignardi et al. |
| 5,471,341 A | 11/1995 | Warde et al. |
| 5,526,172 A | 6/1996 | Kanack |
| 5,559,358 A | 9/1996 | Burns et al. |
| 5,561,523 A | 10/1996 | Blomberg et al. |
| 5,636,052 A | 6/1997 | Arney et al. |
| 5,646,729 A | 7/1997 | Koskinen et al. |
| 5,646,768 A | 7/1997 | Kaeiyama |
| 5,661,592 A | 8/1997 | Bornstein et al. |
| 5,665,997 A | 9/1997 | Weaver et al. |
| 5,699,181 A | 12/1997 | Choi |
| 5,710,656 A | 1/1998 | Goosen |
| 5,719,068 A | 2/1998 | Suzawa et al. |
| 5,734,177 A | 3/1998 | Sakamoto |
| 5,786,927 A | 7/1998 | Greywall et al. |
| 5,808,781 A | 9/1998 | Arney et al. |
| 5,818,095 A | 10/1998 | Sampsell |
| 5,825,528 A | 10/1998 | Goosen |
| 5,838,484 A | 11/1998 | Goossen et al. |
| 5,867,302 A | 2/1999 | Fleming |
| 5,914,804 A | 6/1999 | Goossen |
| 5,920,418 A | 7/1999 | Shiono et al. |
| 5,961,848 A | 10/1999 | Jacquet et al. |
| 6,028,689 A | 2/2000 | Michalicek et al. |
| 6,040,937 A | 3/2000 | Miles |
| 6,046,659 A | 4/2000 | Loo et al. |
| 6,055,090 A | 4/2000 | Miles |
| 6,100,861 A | 8/2000 | Cohen et al. |
| 6,242,932 B1 | 6/2001 | Hembree |
| 6,262,697 B1 | 7/2001 | Stephenson |
| 6,327,071 B1 | 12/2001 | Kimura |
| 6,335,235 B1 | 1/2002 | Bhekta et al. |
| 6,356,378 B1 | 3/2002 | Huibers |
| 6,384,952 B1 | 5/2002 | Clark et al. |
| 6,433,917 B1 | 8/2002 | Mei et al. |
| 6,438,282 B1 | 8/2002 | Takeda et al. |
| 6,452,712 B2 | 9/2002 | Atobe et al. |
| 6,466,354 B1 | 10/2002 | Gudeman |
| 6,556,338 B2 | 4/2003 | Han et al. |
| 6,574,033 B1 | 6/2003 | Chui et al. |
| 6,597,490 B2 | 7/2003 | Tayebati |
| 6,608,268 B1 | 8/2003 | Goldsmith |
| 6,632,698 B2 | 10/2003 | Ives |
| 6,650,455 B2 | 11/2003 | Miles |
| 6,657,832 B2 | 12/2003 | Williams et al. |
| 6,661,561 B2 | 12/2003 | Fitzpatrick et al. |
| 6,674,562 B1 | 1/2004 | Miles et al. |
| 6,680,792 B2 | 1/2004 | Miles |
| 6,698,295 B1 | 3/2004 | Sherrer |
| 6,710,908 B2 | 3/2004 | Miles et al. |
| 6,794,119 B2 | 9/2004 | Miles |
| 6,813,059 B2 | 11/2004 | Hunter et al. |
| 6,841,081 B2 | 1/2005 | Chang et al. |
| 6,844,959 B2 | 1/2005 | Huibers et al. |
| 6,862,127 B1 | 3/2005 | Ishii |
| 6,867,896 B2 | 3/2005 | Miles |
| 6,870,654 B2 | 3/2005 | Lin et al. |
| 6,882,458 B2 | 4/2005 | Lin et al. |
| 6,882,461 B1 | 4/2005 | Tsai et al. |
| 6,912,022 B2 | 6/2005 | Lin et al. |
| 6,940,630 B2 | 9/2005 | Xie |
| 6,947,200 B2 | 9/2005 | Huibers |
| 6,952,303 B2 | 10/2005 | Lin et al. |
| 6,958,847 B2 | 10/2005 | Lin |
| 6,980,350 B2 | 12/2005 | Hung et al. |
| 6,983,135 B1 | 1/2006 | Tsai et al. |
| 7,006,272 B2 | 2/2006 | Tsai |
| 7,027,204 B2 | 4/2006 | Trisnadi et al. |
| 7,034,981 B2 | 4/2006 | Makigaki |
| 7,046,422 B2 | 5/2006 | Kimura et al. |
| 7,119,945 B2 | 10/2006 | Kothari et al. |
| 7,123,216 B1 | 10/2006 | Miles |
| 7,126,738 B2 | 10/2006 | Miles |
| 7,130,104 B2 | 10/2006 | Cummings |
| 7,184,195 B2 | 2/2007 | Yang |
| 7,184,202 B2 | 2/2007 | Miles et al. |
| 7,198,873 B2 | 4/2007 | Geh et al. |
| 7,221,495 B2 | 5/2007 | Miles et al. |
| 7,236,284 B2 | 6/2007 | Miles |
| 7,245,285 B2 | 7/2007 | Yeh et al. |
| 7,289,259 B2 | 10/2007 | Chui et al. |
| 7,302,157 B2 | 11/2007 | Chui |
| 7,321,456 B2 | 1/2008 | Cummings |
| 7,321,457 B2 | 1/2008 | Heald |
| 7,327,510 B2 | 2/2008 | Cummings et al. |
| 7,372,613 B2 | 5/2008 | Chui et al. |
| 7,372,619 B2 | 5/2008 | Miles |
| 7,385,744 B2 | 6/2008 | Kogut et al. |
| 7,385,762 B2 | 6/2008 | Cummings |
| 7,400,488 B2 | 7/2008 | Lynch et al. |
| 7,420,725 B2 | 9/2008 | Kothari |
| 7,436,573 B2 | 10/2008 | Doan et al. |
| 7,460,291 B2 | 12/2008 | Sampsell et al. |
| 7,460,292 B2 | 12/2008 | Chou |
| 7,476,327 B2 | 1/2009 | Tung et al. |
| 7,492,503 B2 | 2/2009 | Chui |
| 7,513,327 B1 | 5/2009 | Cummings |
| 7,527,995 B2 | 5/2009 | Sampsell |
| 7,532,377 B2 | 5/2009 | Miles |
| 7,542,189 B2 | 6/2009 | Tanimura et al. |
| 7,550,810 B2 | 6/2009 | Mignard et al. |
| 7,554,711 B2 | 6/2009 | Miles |
| 7,554,714 B2 | 6/2009 | Chui et al. |
| 7,564,612 B2 | 7/2009 | Chui |
| 7,612,933 B2 | 11/2009 | Djordjev |
| 7,629,197 B2 | 12/2009 | Luo et al. |
| 2001/0003487 A1 | 6/2001 | Miles |
| 2001/0028503 A1 | 10/2001 | Flanders et al. |
| 2001/0043171 A1 | 11/2001 | Van Gorkom et al. |
| 2002/0054424 A1 | 5/2002 | Miles |
| 2002/0070931 A1 | 6/2002 | Ishikawa |
| 2002/0075555 A1 | 6/2002 | Miles |
| 2002/0126364 A1 | 9/2002 | Miles |
| 2002/0146200 A1 | 10/2002 | Kurdle et al. |
| 2002/0149828 A1 | 10/2002 | Miles |
| 2002/0154422 A1 | 10/2002 | Sniegowski et al. |
| 2003/0016428 A1 | 1/2003 | Kato et al. |
| 2003/0035196 A1 | 2/2003 | Walker |
| 2003/0043157 A1 | 3/2003 | Miles |
| 2003/0053078 A1 | 3/2003 | Missey et al. |
| 2003/0119221 A1 | 6/2003 | Cunningham et al. |
| 2003/0138669 A1 | 7/2003 | Kojima et al. |
| 2003/0202265 A1 | 10/2003 | Reboa et al. |
| 2003/0202266 A1 | 10/2003 | Ring et al. |
| 2004/0008396 A1 | 1/2004 | Stappaerts |
| 2004/0008438 A1 | 1/2004 | Sato |
| 2004/0027671 A1 | 2/2004 | Wu et al. |
| 2004/0027701 A1 | 2/2004 | Ishikawa |
| 2004/0043552 A1 | 3/2004 | Strumpell et al. |
| 2004/0058532 A1 | 3/2004 | Miles et al. |
| 2004/0075967 A1 | 4/2004 | Lynch et al. |
| 2004/0076802 A1 | 4/2004 | Tompkin et al. |
| 2004/0080035 A1 | 4/2004 | Delapierre |
| 2004/0100594 A1 | 5/2004 | Huibers et al. |

| | | |
|---|---|---|
| 2004/0100677 A1 | 5/2004 | Huibers et al. |
| 2004/0125281 A1 | 7/2004 | Lin et al. |
| 2004/0125282 A1 | 7/2004 | Lin et al. |
| 2004/0145811 A1 | 7/2004 | Lin et al. |
| 2004/0147198 A1 | 7/2004 | Lin et al. |
| 2004/0175577 A1 | 9/2004 | Lin et al. |
| 2004/0184134 A1 | 9/2004 | Makigaki |
| 2004/0207897 A1 | 10/2004 | Lin |
| 2004/0209195 A1 | 10/2004 | Lin |
| 2004/0217919 A1 | 11/2004 | Pichi et al. |
| 2004/0218251 A1 | 11/2004 | Piehl et al. |
| 2004/0240032 A1 | 12/2004 | Miles |
| 2005/0002082 A1 | 1/2005 | Miles |
| 2005/0003667 A1 | 1/2005 | Lin et al. |
| 2005/0024557 A1 | 2/2005 | Lin |
| 2005/0035699 A1 | 2/2005 | Tsai |
| 2005/0036095 A1 | 2/2005 | Yeh et al. |
| 2005/0046919 A1 | 3/2005 | Taguchi et al. |
| 2005/0046922 A1 | 3/2005 | Lin et al. |
| 2005/0046948 A1 | 3/2005 | Lin |
| 2005/0068627 A1 | 3/2005 | Nakamura et al. |
| 2005/0078348 A1 | 4/2005 | Lin |
| 2005/0168849 A1 | 8/2005 | Lin |
| 2005/0179378 A1 | 8/2005 | Oooka et al. |
| 2005/0195462 A1 | 9/2005 | Lin |
| 2006/0007517 A1 | 1/2006 | Tsai |
| 2006/0017379 A1 | 1/2006 | Su et al. |
| 2006/0017689 A1 | 1/2006 | Faase et al. |
| 2006/0024880 A1 | 2/2006 | Chui et al. |
| 2006/0065940 A1 | 3/2006 | Kothari |
| 2006/0066599 A1 | 3/2006 | Chui |
| 2006/0066640 A1 | 3/2006 | Kothari et al. |
| 2006/0066641 A1 | 3/2006 | Gally et al. |
| 2006/0066936 A1 | 3/2006 | Chui et al. |
| 2006/0067649 A1 | 3/2006 | Tung et al. |
| 2006/0077155 A1 | 4/2006 | Chui et al. |
| 2006/0077156 A1 | 4/2006 | Chui et al. |
| 2006/0220160 A1 | 10/2006 | Miles |
| 2007/0020948 A1 | 1/2007 | Piehl et al. |
| 2007/0077525 A1 | 4/2007 | Davis et al. |
| 2007/0086078 A1 | 4/2007 | Hagood et al. |
| 2007/0121118 A1 | 5/2007 | Gally et al. |
| 2007/0138608 A1 | 6/2007 | Ikehashi |
| 2007/0177247 A1 | 8/2007 | Miles |
| 2007/0216987 A1 | 9/2007 | Hagood et al. |
| 2007/0247401 A1 | 10/2007 | Sasagawa et al. |
| 2007/0249081 A1 | 10/2007 | Luo et al. |
| 2007/0279729 A1 | 12/2007 | Kothari et al. |
| 2007/0285761 A1 | 12/2007 | Zhong et al. |
| 2008/0002299 A1 | 1/2008 | Thurn |
| 2008/0013144 A1 | 1/2008 | Chui et al. |
| 2008/0013145 A1 | 1/2008 | Chui et al. |
| 2008/0037093 A1 | 2/2008 | Miles |
| 2008/0055706 A1 | 3/2008 | Chui et al. |
| 2008/0055707 A1 | 3/2008 | Kogut et al. |
| 2008/0080043 A1 | 4/2008 | Chui et al. |
| 2008/0088904 A1 | 4/2008 | Miles |
| 2008/0088910 A1 | 4/2008 | Miles |
| 2008/0088911 A1 | 4/2008 | Miles |
| 2008/0088912 A1 | 4/2008 | Miles |
| 2008/0094690 A1 | 4/2008 | Luo et al. |
| 2008/0106782 A1 | 5/2008 | Miles |
| 2008/0110855 A1 | 5/2008 | Cummings |
| 2008/0112035 A1 | 5/2008 | Cummings |
| 2008/0186581 A1 | 8/2008 | Bita et al. |
| 2008/0239455 A1 | 10/2008 | Kogut et al. |
| 2008/0247028 A1 | 10/2008 | Chui et al. |
| 2008/0278787 A1 | 11/2008 | Sasagawa |
| 2008/0278788 A1 | 11/2008 | Sasagawa |
| 2008/0283374 A1* | 11/2008 | Naito .................. 200/181 |
| 2008/0316566 A1 | 12/2008 | Lan |
| 2008/0316568 A1 | 12/2008 | Griffiths et al. |
| 2009/0009845 A1 | 1/2009 | Endisch et al. |
| 2009/0068781 A1 | 3/2009 | Tung et al. |
| 2009/0073534 A1 | 3/2009 | Lee et al. |
| 2009/0073539 A1 | 3/2009 | Mignard |
| 2009/0080060 A1 | 3/2009 | Sampsell et al. |
| 2009/0103166 A1 | 4/2009 | Khazeni et al. |
| 2009/0135465 A1 | 5/2009 | Chui |
| 2009/0147343 A1 | 6/2009 | Kogut et al. |
| 2009/0201566 A1 | 8/2009 | Kothari |
| 2009/0213450 A1 | 8/2009 | Sampsell |
| 2009/0213451 A1 | 8/2009 | Tung et al. |
| 2009/0225395 A1 | 9/2009 | Ganti et al. |
| 2009/0231666 A1 | 9/2009 | Gudlavalleti et al. |
| 2009/0251761 A1 | 10/2009 | Khazeni et al. |
| 2009/0256218 A1 | 10/2009 | Mignard et al. |
| 2009/0257105 A1 | 10/2009 | Xu et al. |
| 2009/0273823 A1 | 11/2009 | Tung et al. |
| 2009/0273824 A1 | 11/2009 | Sasagawa |
| 2009/0279162 A1 | 11/2009 | Chui |
| 2009/0323153 A1 | 12/2009 | Sampsell |
| 2009/0323165 A1 | 12/2009 | Sampsell |
| 2009/0323166 A1 | 12/2009 | Sampsell |
| 2010/0014148 A1 | 1/2010 | Djordjev |
| 2010/0039370 A1 | 2/2010 | Miles |
| 2010/0080890 A1 | 4/2010 | Tung et al. |
| 2010/0085626 A1 | 4/2010 | Tung et al. |
| 2010/0118382 A1 | 5/2010 | Kothari et al. |

FOREIGN PATENT DOCUMENTS

| | | |
|---|---|---|
| EP | 1 122 577 | 8/2001 |
| EP | 1 227 346 | 7/2002 |
| EP | 1 275 997 | 1/2003 |
| EP | 1 473 581 | 11/2004 |
| EP | 1 855 142 | 11/2007 |
| JP | 5-49238 | 2/1993 |
| JP | 5-281479 | 10/1993 |
| JP | 11211999 | 8/1999 |
| JP | 2002-062490 | 2/2000 |
| JP | 2001-221913 | 8/2001 |
| JP | 2002-221678 | 8/2002 |
| JP | 2003-340795 | 2/2003 |
| JP | 2004-012642 | 1/2004 |
| JP | 2004-212638 | 7/2004 |
| JP | 2004-212680 | 7/2004 |
| JP | 2005 279831 | 10/2005 |
| JP | 2005-308871 | 11/2005 |
| WO | WO 98/14804 | 4/1998 |
| WO | WO 02/086582 | 10/2002 |
| WO | WO 2007/036422 | 4/2007 |
| WO | WO 2007/053438 | 5/2007 |
| WO | WO 2007/072998 | 6/2007 |
| WO | WO 2007/120886 | 10/2007 |

OTHER PUBLICATIONS

Feenstra et al., Electrowetting displays, Liquivista BV, 16 pp., Jan. 2006.

Jerman et al., "A Miniature Fabry-Perot Interferometer with a Corrugated Silicon Diaphragm Support", (1988).

Jerman et al., "Miniature Fabry-Perot Interferometers Micromachined in Silicon for Use in Optical Fiber WDM Systems," Transducers, San Francisco, Jun. 24-27, 1991, Proceedings on the Int'l. Conf. on Solid State Sensors and Actuators, vol. CONF. 6, Jun. 24, 1991, pp. 372-375.

Kowarz et al., Conformal grating electromechanical system (GEMS) for high-speed digital light modulation, Proceedings of the IEEEE 15th. Annual International Conference on Micro Electro Mechanical Systems, MEMS 2002, pp. 568-573.

Lezec, Submicrometer dimple array based interference color field displays and sensors, Nano Lett. 7(2):329-333, Dec. 23, 2006.

Miles, A New Reflective FPD Technology Using Interferometric Modulation, Journal of the SID, 5/4, 1997.

Miles, Interferometric modulation: MOEMS as an enabling technology for high performance reflective displays, Proceedings of SPIE, vol. 4985, pp. 131-139, 2003.

Pape et al., Characteristics of the deformable mirror device for optical information processing, Optical Engineering, 22(6):676-681, Nov.-Dec. 1983.

Taii et al., "A transparent sheet display by plastic MEMS," Journal of the SID 14(8):735-741, 2006.

Longhurst, 1963, Chapter IX: Multiple Beam Interferometry, in Geometrical and Physical Optics, pp. 153-157.

Tolansky, 1948, Chapter II: Multiple-Beam Interference, in Multiple-bean Interferometry of Surfaces and Films, Oxford at the Clarendon Press, pp. 8-11.

ISR and WO dated Oct. 16, 2009 in PCT/US09/050172.

\* cited by examiner

|  | Column Output Signals | |
|---|---|---|
|  | $+V_{bias}$ | $-V_{bias}$ |
| Row Output Signals  0 | Stable | Stable |
| $+\Delta V$ | Relax | Actuate |
| $-\Delta V$ | Actuate | Relax |

STICTION MITIGATION WITH INTEGRATED MECH MICRO-CANTILEVERS THROUGH VERTICAL STRESS GRADIENT CONTROL

CROSS-REFERENCE TO RELATED APPLICATIONS

This application claims priority to U.S. Provisional Patent Application No. 61/080,005 filed on Jul. 11, 2008, entitled "STICTION MITIGATION WITH INTEGRATED MECH MICRO-CANTILEVERS THROUGH VERTICAL STRESS GRADIENT CONTROL," by Yeh-Jiun Tung, which is incorporated herein by reference in its entirety.

BACKGROUND

1. Field

The present disclosure relates to micro-electromechanical systems. More particularly, some embodiments relate to systems and methods for improving the micro-electromechanical operation of interferometric modulators.

2. Description of the Related Technology

Micro-electromechanical systems (MEMS) include micro mechanical elements, actuators, and electronics. Micromechanical elements may be created using deposition, etching, and/or other micromachining processes that etch away parts of substrates and/or deposited material layers or that add layers to form electrical and electromechanical devices. One type of MEMS device is called an interferometric modulator. An interferometric modulator or interferometric light modulator refers to a device that selectively absorbs and/or reflects light using the principles of optical interference. An interferometric modulator may comprise a pair of conductive plates, one or both of which may be transparent and/or reflective in whole or part and capable of relative motion upon application of an appropriate electrical signal. One plate may comprise a stationary layer deposited on a substrate and the other plate may comprise a metallic membrane separated from the stationary layer by an air gap. The position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY

In one embodiment, a micro-electromechanical (MEMS) device comprises a first component, a second component, and at least one restoration feature. The second component is movable relative to the first component in a first direction. The at least one restoration feature may be on the second component and can apply a restoring force to the second component in a second direction opposite to the first direction. The at least one restoration feature comprises at least one deflecting portion that borders an opening through the second component and extends towards the first component when the first and second components are apart from each other.

In an embodiment, a micro-electromechanical (MEMS) apparatus comprises: means for partially reflecting light; means for reflecting light, wherein the reflecting means is movable in a first direction relative to the partially reflecting means; and means for applying a restoring force to the reflecting means, the restoring means on the reflecting means, the restoring force in a second direction opposite to the first direction, the restoring means bordering an opening through the reflecting means and extending towards the partially reflecting means when the partially reflecting means and the reflecting means are apart from each other.

In another embodiment, a method of fabricating a micro electromechanical systems (MEMS) device comprises: forming an electrode layer over a substrate; depositing a sacrificial layer over the electrode layer; depositing a reflective layer over the sacrificial layer; forming a plurality of support structures, said support structures extending through the sacrificial layer; depositing a mechanical layer over the plurality of support structures; and patterning the mechanical layer to form at least one restoration feature from etch holes in the mechanical layer.

DETAILED DESCRIPTION OF THE PREFERRED EMBODIMENTS

Figure 1:
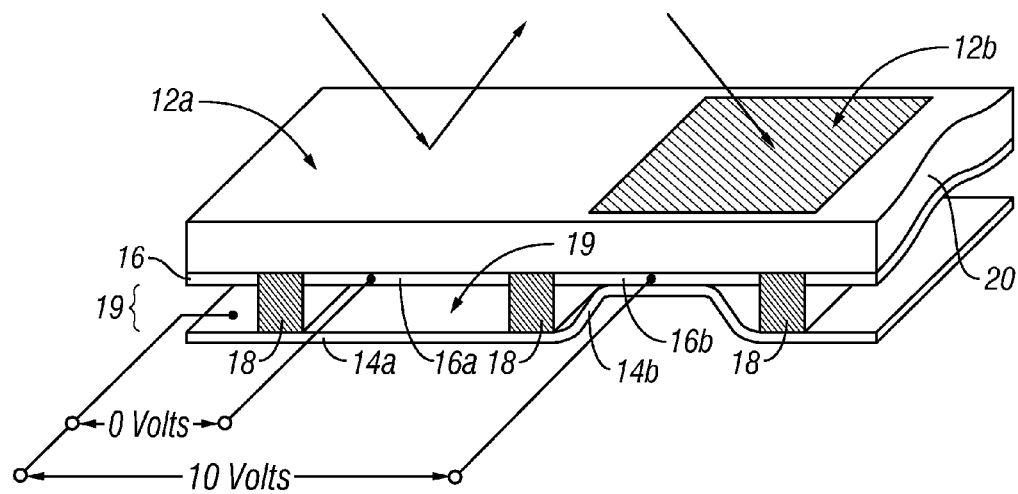
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

The present disclosure relates to the mitigation of stiction in MEMS devices. In MEMS devices, stiction can cause a movable component in a device to stick temporarily or permanently, and thus, may cause the device to fail or operate improperly.

In certain embodiments described herein, a MEMS device may be provided with one or more restoration features that provide an assisting mechanical force for mitigating stiction. For example, in some embodiments, the restoration feature is a cantilever that deflects when at least one component comes into contact or proximity with another component. This deflection of the restoration feature results in a restoration force that is applied in a direction generally opposite to the direction of movement of the at least one component.

The restoration feature may be implemented as one or more deflectable elements, where the deflectable elements may have various configurations or shapes, such as a chevron, cross, and the like. Multiple restoration features also may be employed and placed strategically within the MEMS device to maximize their effectiveness in mitigating stiction.

Furthermore, the restoration feature may have benefits beyond mitigating stiction. For example, holes or slots formed in the at least one component to create the restoration feature can provide a conduit for etchant and the removal of a sacrificial layer during fabrication. As such, the restoration feature may provide a combination of functions not limited to mitigating stiction. For example, the restoration features may be useful to reduce snap in and to modify hysteretic behavior. This may be useful for characteristics such as providing additional control of the displayed color of a device. As another example, the restoration feature may provide a mechanism for reducing or increasing response time by inhibiting actuation and enhancing release of the device.

In some embodiments, one or more restoration features may be fabricated into one or more components of a MEMS device using various techniques. For example, the restoration feature may be fabricated by including a stress gradient in a direction generally perpendicular to the component and selectively patterning release structures (e.g., holes or slots) in the component, such that a portion of the elements of the restoration feature deflect in a direction generally perpendicular to the component. Different layers of materials to obtain desired restoration forces and shapes may be employed. For illustrative purposes, certain embodiments of these restoration features may be described in applications for an optical interferometric modulator (IMOD) MEMS device.

The following detailed description is directed to certain specific embodiments. However, the teachings of the present disclosure can be implemented in a multitude of different ways. In this description, reference is made to the drawings wherein like parts are designated with like numerals throughout. The embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

The figures are provided to illustrate various embodiments. In particular, FIGS. 1-7 illustrate various aspects of an interferometric modulator display and display system. FIGS. 8A-8K are then provided to illustrate various embodiments of one or more restoration features that may be employed in various interferometric modulators. FIGS. 9A-9H illustrate a fabrication process of the interferometric modulator including the restoration features. These figures will now be further described below.

Referring now to FIG. 1, an interferometric modulator display embodiment comprising an interferometric MEMS display element is illustrated. In these devices, the pixels are in either a bright or dark state. In the bright (on or open) state, the display element reflects a large portion of incident visible light to a user. When in the dark (off or closed) state, the display element reflects little incident visible light to the user. Depending on the embodiment, the light reflectance properties of the on and off states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical gap with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise several fused layers, which can include an electrode layer, such as indium tin oxide (ITO), a partially reflective layer, such as chromium, and a transparent dielectric. The optical stack 16 is thus electrically conductive, partially transparent, and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack 16 are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device.

With no applied voltage, the gap 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

Figure 2:
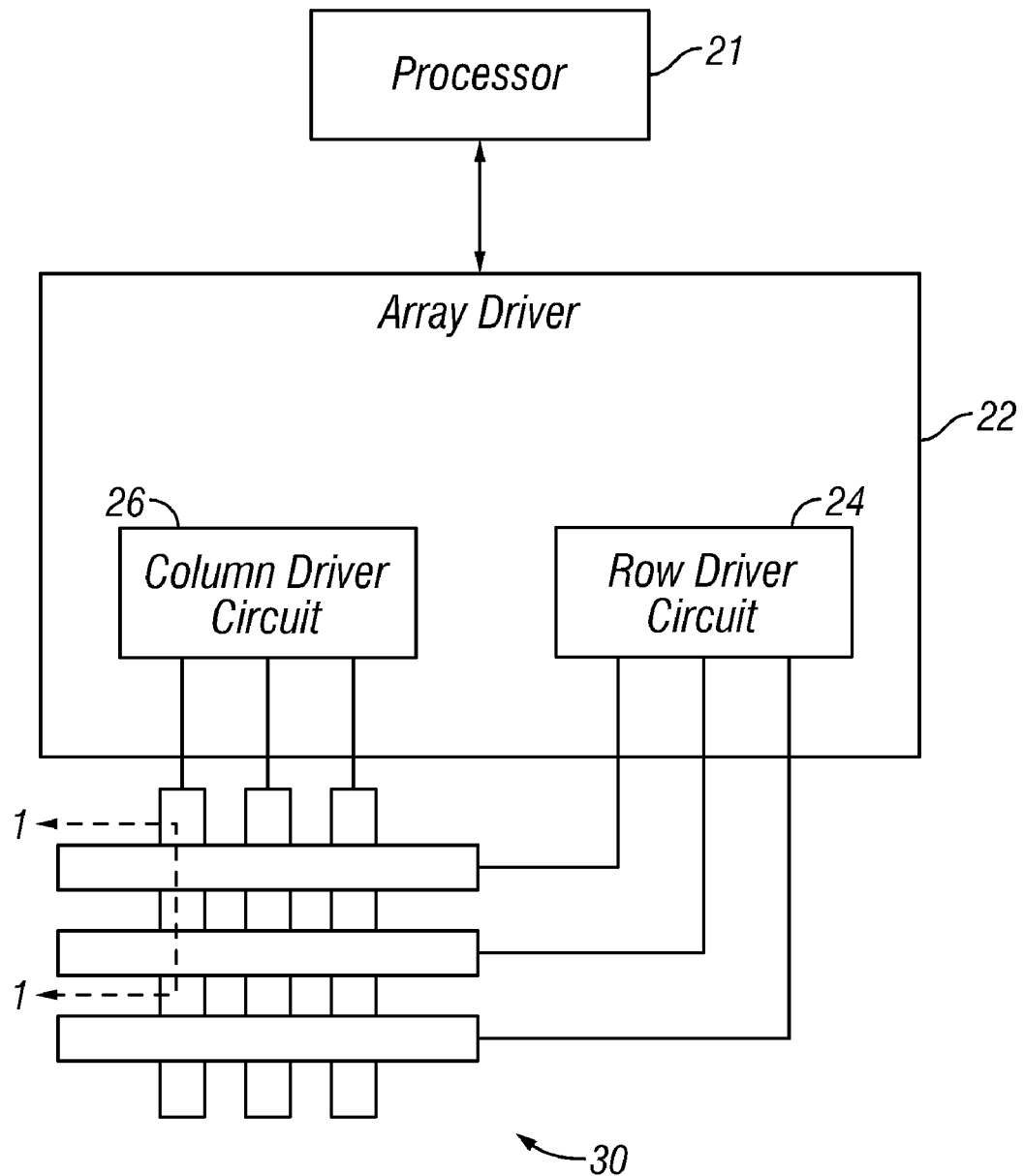
FIG. 2 is a system block diagram illustrating one embodiment of an electronic device incorporating a 3×3 interferometric modulator display.

FIGS. 2 through 5B illustrate one exemplary process and system for using an array of interferometric modulators in a display application. FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA°, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. Thus, there exists a window of applied voltage, about 3 to 7 V in the example illustrated in FIG. 3, within which the device is stable in either the relaxed or actuated state. This is referred to herein as the hysteresis window or stability window. For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the stability window of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
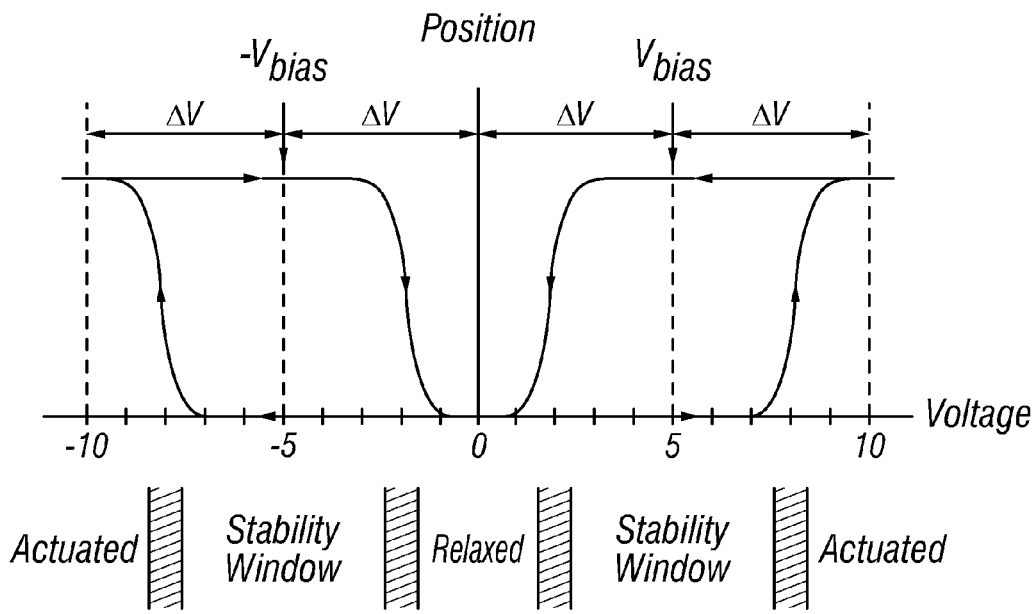
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.
Figure 5A:
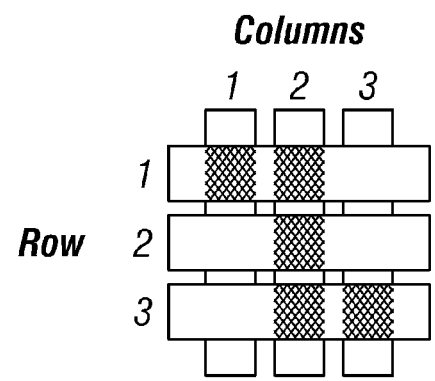
FIG. 5A illustrates one exemplary frame of display data in the 3×3 interferometric modulator display of FIG. 2.
Figure 5B:
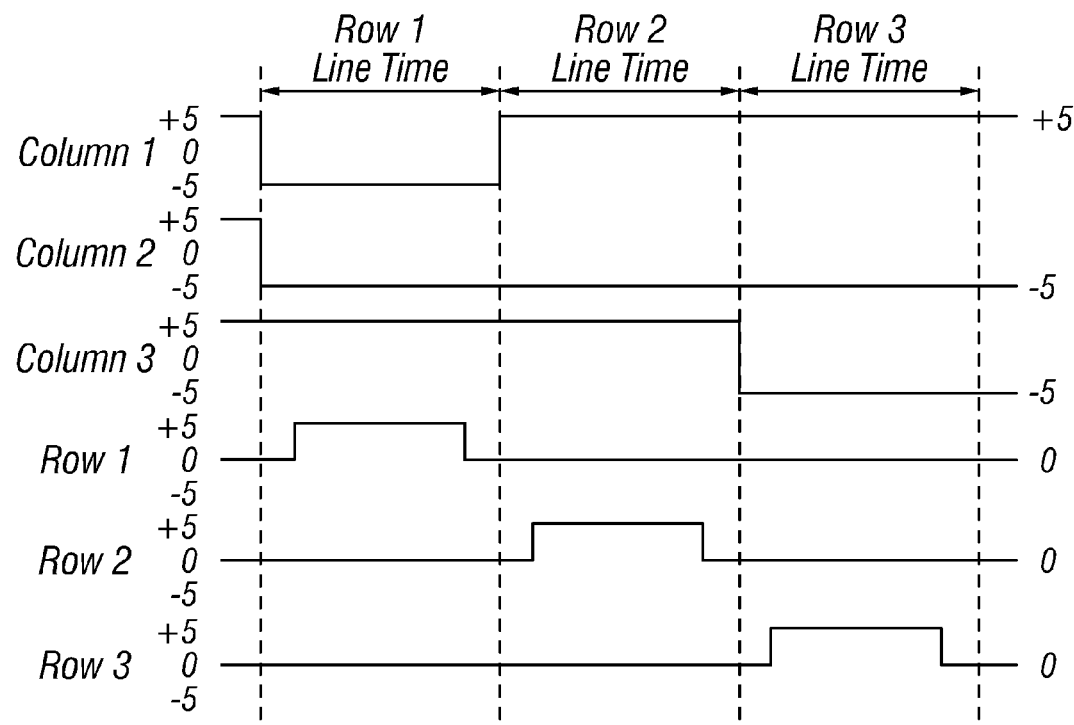
FIG. 5B illustrates one exemplary timing diagram for row and column signals that may be used to write the frame of FIG. 5A.

FIGS. 4, 5A, and 5B illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts, respectively. Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1, 1), (1, 2), (2, 2), (3, 2) and (3, 3) are actuated. To accomplish this, during a line time for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1, 1) and (1, 2) pixels and relaxes the (1, 3) pixel. No other pixels in the array are affected. To set row 2 as desired, column 2 is set to −5 volts, and columns 1 and 3 are set to +5 volts. The same strobe applied to row 2 will then actuate pixel (2, 2) and relax pixels (2, 1) and (2, 3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
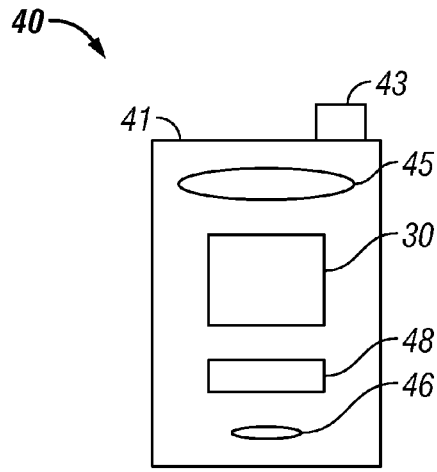
FIGS. 6A and 6B are system block diagrams illustrating an embodiment of a visual display device comprising a plurality of interferometric modulators.
Figure 6B:
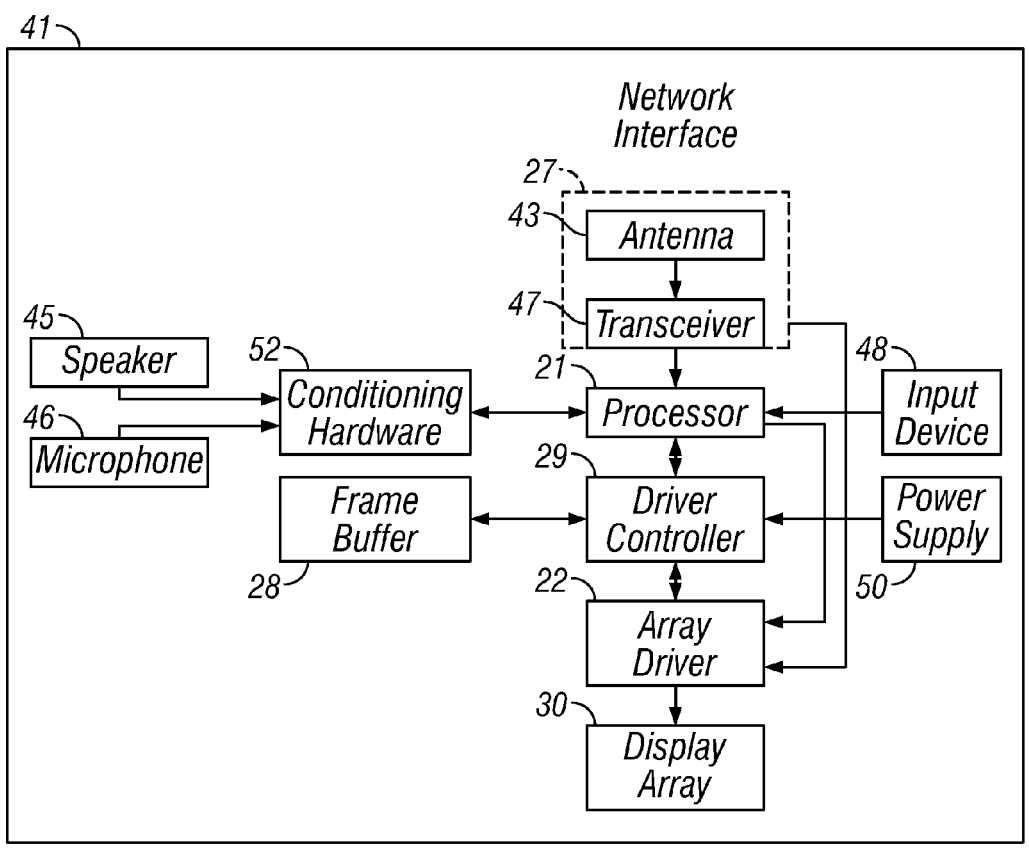

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 45, an input device 48, and a microphone 46. The housing 41 is generally formed from any of a variety of manufacturing processes as are well known to those of skill in the art, including injection molding and vacuum forming. In addition, the housing 41 may be made from any of a variety of materials, including, but not limited to, plastic, metal, glass, rubber, and ceramic, or a combination thereof. In one embodiment, the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43, which is coupled to a transceiver 47. The transceiver 47 is connected to a processor 21, which is connected to conditioning hardware 52. The conditioning hardware 52 may be configured to condition a signal (e.g., filter a signal). The conditioning hardware 52 is connected to a speaker 45 and a microphone 46. The processor 21 is also connected to an input device 48 and a driver controller 29. The driver controller 29 is coupled to a frame buffer 28 and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one or more devices over a network. In one embodiment, the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS, or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, network interface 27 can be replaced by an image source, which can store or generate image data to be sent to the processor 21. For example, the image source can be a digital video disc (DVD) or a hard-disc drive that contains image data, or a software module that generates image data.

Processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. Conditioning hardware 52 generally includes amplifiers and filters for transmitting signals to the speaker 45, and for receiving signals from the microphone 46. Conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, driver controller 29 is a conventional display controller or a bi-stable display controller (e.g., an interferometric modulator controller). In another embodiment, array driver 22 is a conventional driver or a bi-stable display driver (e.g., an interferometric modulator display). In one embodiment, a driver controller 29 is integrated with the array driver 22. Such an embodiment is common in highly integrated systems such as cellular phones, watches, and other small area displays. In yet another embodiment, display array 30 is a typical display array or a bi-stable display array (e.g., a display including an array of interferometric modulators).

The input device 48 allows a user to control the operation of the exemplary display device 40. In one embodiment, input device 48 includes a keypad, such as a QWERTY keyboard or a telephone keypad, a button, a switch, a touch-sensitive screen, or a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

Power supply 50 can include a variety of energy storage devices as are well known in the art. For example, in one embodiment, power supply 50 is a rechargeable battery, such as a nickel-cadmium battery or a lithium ion battery. In another embodiment, power supply 50 is a renewable energy source, a capacitor, or a solar cell including a plastic solar cell, and solar-cell paint. In another embodiment, power supply 50 is configured to receive power from a wall outlet.

In some embodiments, control programmability resides, as described above, in a driver controller which can be located in several places in the electronic display system. In some embodiments, control programmability resides in the array driver 22. Those of skill in the art will recognize that the above-described optimizations may be implemented in any number of hardware and/or software components and in various configurations.

Figure 7A:
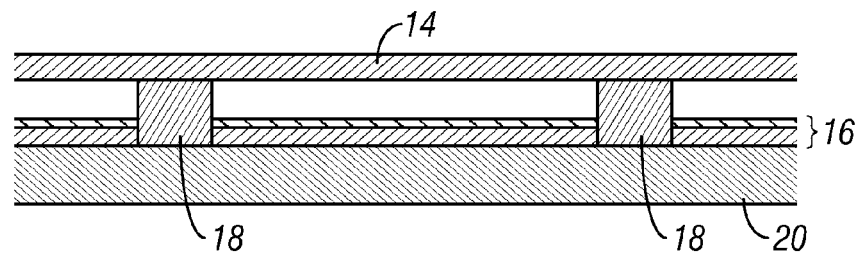
FIG. 7A is a cross section of the device of FIG. 1.
Figure 7B:
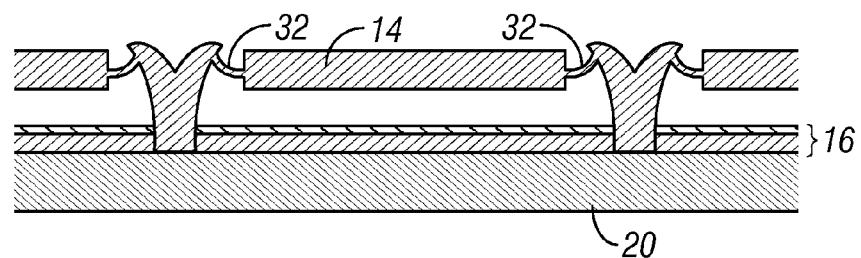
FIG. 7B is a cross section of an alternative embodiment of an interferometric modulator.
Figure 7C:
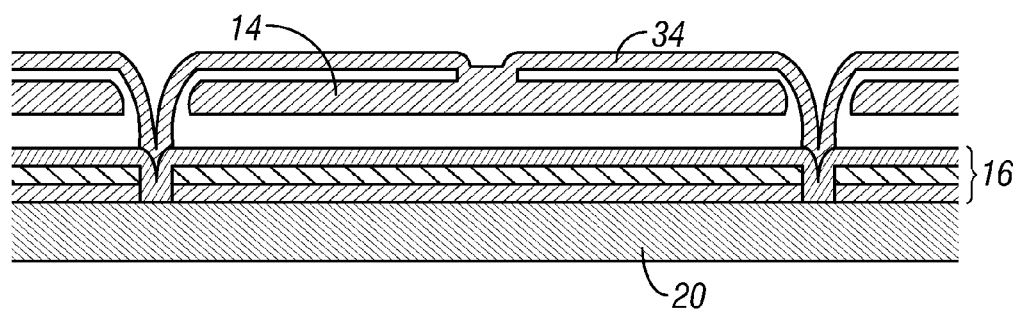
FIG. 7C is a cross section of another alternative embodiment of an interferometric modulator.
Figure 7D:
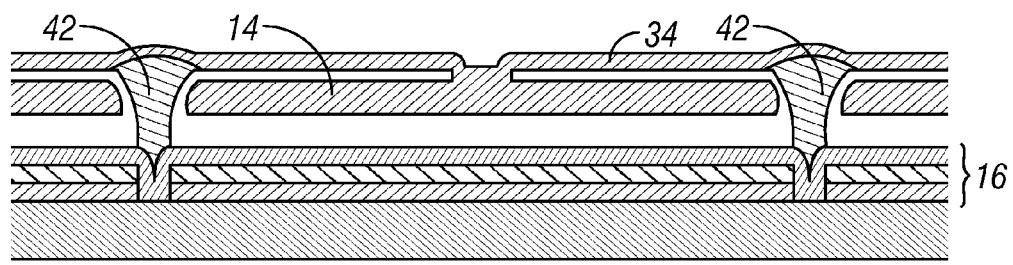
FIG. 7D is a cross section of yet another alternative embodiment of an interferometric modulator.
Figure 7E:
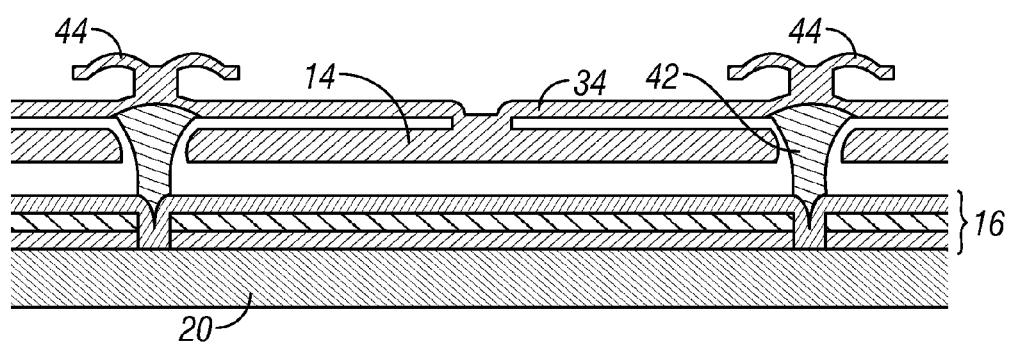
FIG. 7E is a cross section of an additional alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the moveable reflective layer 14 is attached to supports at the corners only, on tethers 32. In FIG. 7C, the moveable reflective layer 14 is suspended from a deformable layer 34, which may comprise a flexible metal. The deformable layer 34 connects, directly or indirectly, to the substrate 20 around the perimeter of the deformable layer 34. These connections are herein referred to as support posts. The embodiment illustrated in FIG. 7D has support post plugs 42 upon which the deformable layer 34 rests. The movable reflective layer 14 remains suspended over the gap, as in FIGS. 7A-7C, but the deformable layer 34 does not form the support posts by filling holes between the deformable layer 34 and the optical stack 16. Rather, the support posts are formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C, as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. Such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

The restoration features 513 can provide, among other things, additional force to separate the deformable layer 506 from the stationary layer 502, and this additional force can mitigate or overcome the adhesion forces. As will be described below in detail, the restoration features 513 are provided to help the recovery of the deformable layer 506 from its driven state to the undriven state by applying an additional force onto the deformable layer 506 in the direction away from the stationary layer 502.

Figure 8A:
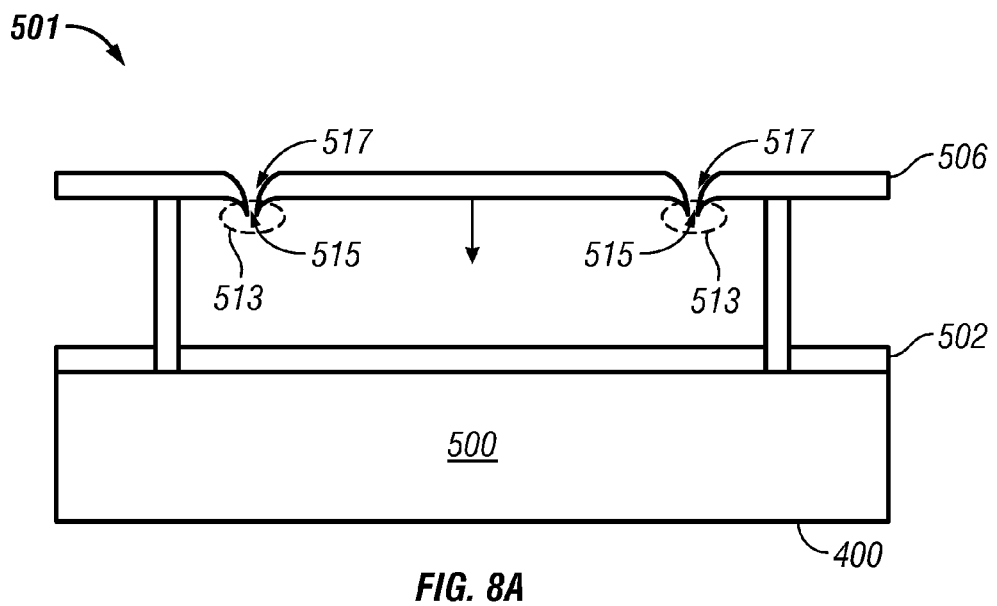
FIG. 8A is a side cross-sectional view of an embodiment of the interferometric modulator including restoration features with the modulator shown in the undriven state.

For example, in the illustrated embodiment shown in FIG. 8A, in the undriven state, a portion of the restoration features 513 may curl or curve toward the stationary layer 502 and thus extend into the air gap between the deformable layer 506 and the stationary layer 502. As will be described more fully below, this portion may result from a stress gradient that can be fabricated into at least the portion of the deformable layer 506 and/or the stationary layer 502, which comprise the deflecting portions 515.

When undriven, the deformable layer 506 may be apart from the stationary layer 502 and the deflecting portions 515 of restoration features 513 may extend towards the stationary layer 502 (e.g., into the region between stationary layer 502 and deformable layer 506). When driven, the deformable layer 506 deforms into the driven state illustrated in FIG. 8B. The deflecting portions of 515 of restoration features 513 deform by contact of the deformable layer 506 and thus conform to shape of the stationary layer 502 that comes in contact with restoration features 513. For example, in certain embodiments, the restoration features 513 may deflect into the substantially flat configuration shown in FIG. 8B. In certain embodiments, the restoration features 513 may deflect into other configurations, such as curved or bowed shapes depending on the contact area of deformable layer 506. In their deflected state, the restoration features 513 may provide a potential assisting force that can mitigate or prevent stiction.

In certain embodiments, the deflecting portions 515 do not completely close the openings 517 when the deformable layer 506 is in the driven state. In other embodiments, the deflecting portions 515 are deformed to nearly close or completely close the openings 517 when the deformable layer 506 is in the driven state.

The restoration features 513 deflected, even in a flat configuration, will have a tendency to return to their normal deflected configuration, e.g., having a portion that tends to extend back into the interferometric cavity as shown in FIG. 8A. This tendency can produce a force that tends to assist the deformable layer 506 to return to its undriven state. Therefore, when the deformed layer 506 begins to move from the deformed state back to its undriven state, the force of the restoration features 513 can help mitigate stiction and/or speed of the recovery of the deformable layer 506.

The restoration features 513 may be configured with various sizes. For example, as shown in the figures, the deflecting portions 515 may be a cantilever having a length that partially spans the gap between deformable layer 506 and the stationary layer 502. In other embodiments, the deflecting portions 515 may be cantilevers that are long enough to contact or come into near contact with the stationary layer 502 even in their undriven state. These different sizes of the deflecting portions 515 can be useful to reduce snap in and to control the hysteretic behavior of the device. Alternatively, different lengths of deflecting portions 515 may be utilized in order to modify the actuation and release times of the device during operation. In order to minimize impact on optical or color performance, various restoration features 513 may be located in regions that are not within the viewable area of the device.

One skilled in the art will recognize that the restoration features 513 may not have the exact configuration as illustrated in FIGS. 8A-8K. Many different types of structures may be employed as the restoration features 513. Additionally, different materials can also be employed.

For the sake of convenience, the term restoration feature can refer to any and all mechanisms having the function of exerting a restoration force that assists the deformed layer 506 in returning to its undriven state. Although two restoration features 513 are illustrated in FIGS. 8A-8D, a single restoration feature (such as in FIGS. 8E-8F) or any number of restoration features may be employed. For example, multiple restoration features 513 can be arranged across various areas of the deformable layer 506. In particular, the restoration features 513 may be placed in a specific area on the deformable layer 506, or may be placed to provide relatively even restoration forces over a wide area on the deformable layer 506.

In addition, the restoration features 513 can be configured to provide different strengths of restoration forces depending on their location on the deformable layer 506. The size, placement and strength of the restoration features 513 can all be varied according to the desired characteristics of the interferometric modulator 501. In certain embodiments the initial voltage input may be adjusted in order to drive the interferometric modulators 501 to their fully driven state, as the restoration features 513 may create an increased amount of resistance against the driven state of modulators 501.

In addition, the restoration features 513 may include one or more layers coated by an anti-stiction polymer coating, which can reduce the degree of adhesion between the deformable layer 506 and the stationary layer 502 when in contact with each other. The restoration features 513 may also be textured or have a roughened surface to reduce contact area, and thus, the amount of adhesion between the deformable layer 506 and the stationary layer 502 when in contact.

Figure 8B:
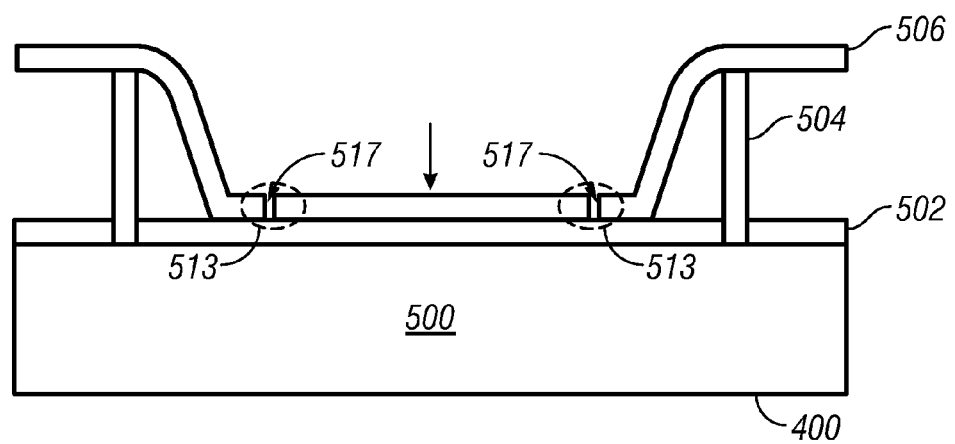
FIG. 8B is a side cross-sectional view of the embodiment of FIG. 9A in the driven state.

In order to illustrate various embodiments of the restoration features 513, FIGS. 8A-K will now be further described. FIGS. 8A and 8B illustrate an embodiment of the interferometric modulator 501, which includes the restoration features 513. The restoration features 513 may extend from the deformable layer 506. Accordingly, when the interferometric modulator 501 is driven from its undriven state (FIG. 8A) to the driven state (FIG. 8B), the restoration features 513 are deflected from their normal configuration to a relatively flat configuration. In some embodiments, the restoration features 513 may be configured to deflect only partially (rather than completely flat), and thus, define a gap or minimum distance (not shown) between the stationary layer 502 and the portions of the deformable layer 506 not contacting the stationary layer 502 when the interferometric modulator 501 is in the driven state.

Figure 8C:
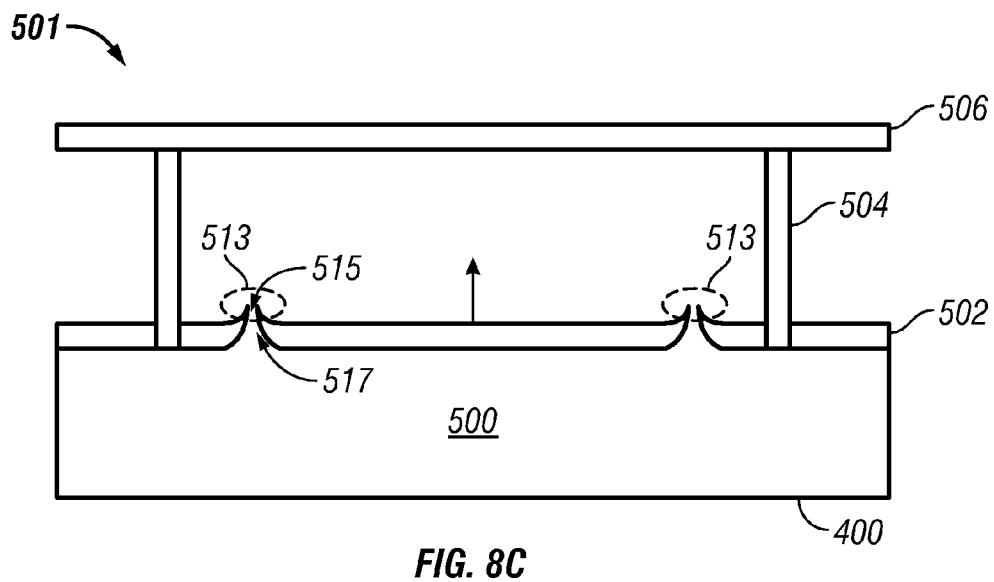
FIGS. 8C-F show side cross-sectional views of various embodiments of the interferometric modulator including restoration features with the modulator shown in the undriven state.
Figure 8D:
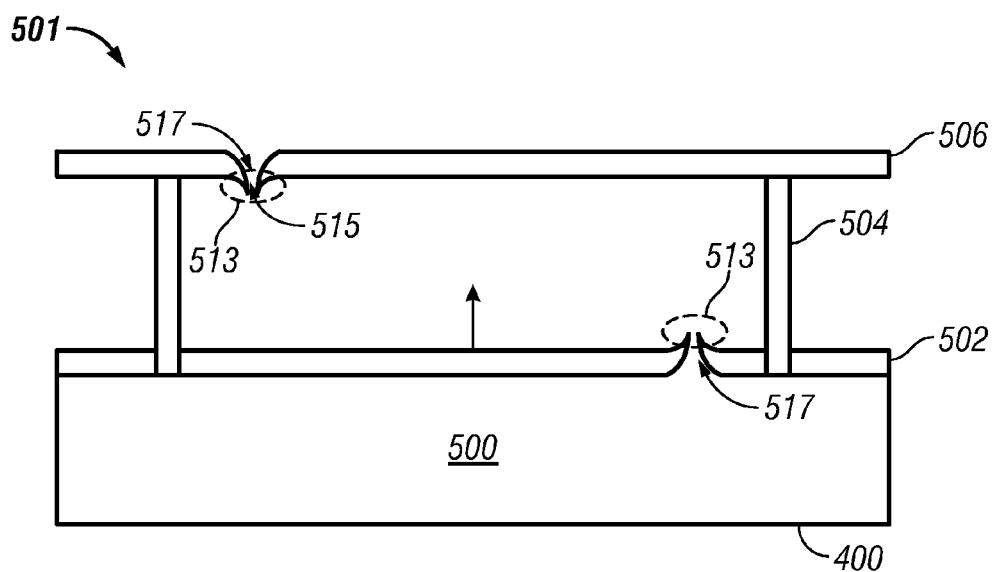

In another embodiment as illustrated in FIG. 8C, the restoration features 513 may be formed on the top surface of the stationary layer 502. In another embodiment illustrated in FIG. 8D, the restoration features 513 may be positioned on both the deformable layer 506 and the stationary layer 502. Although not illustrated, the restoration features 513 may extend from various sub-layers, if any, of the deformable layer 506 or from various sub-layers of the stationary layer 502 or substrate 500.

Figure 8E:
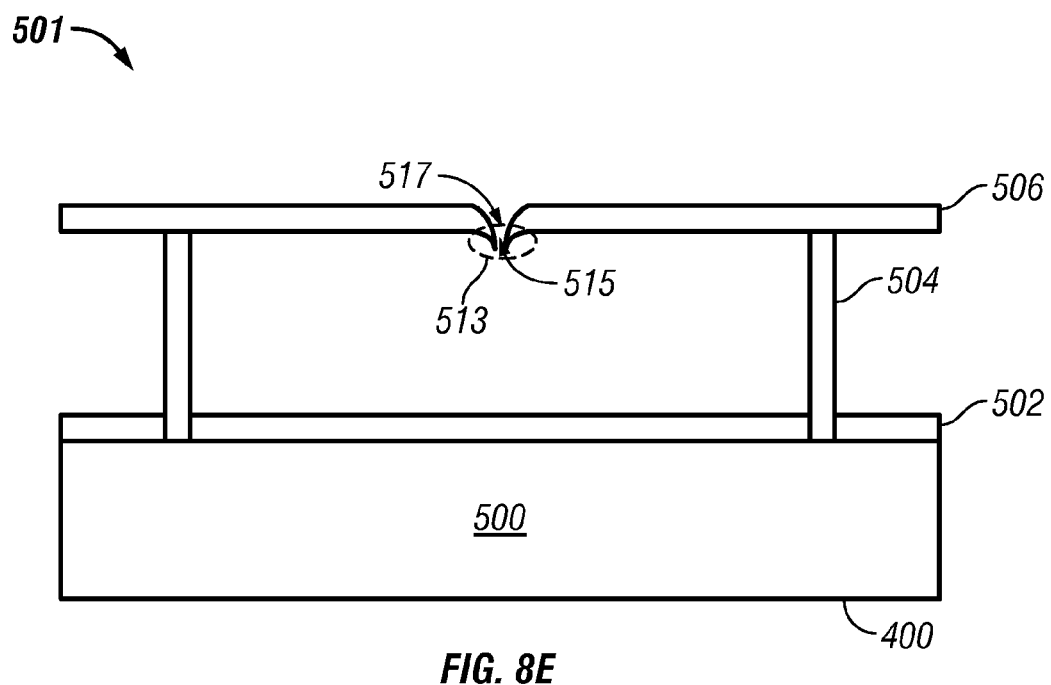
Figure 8F:
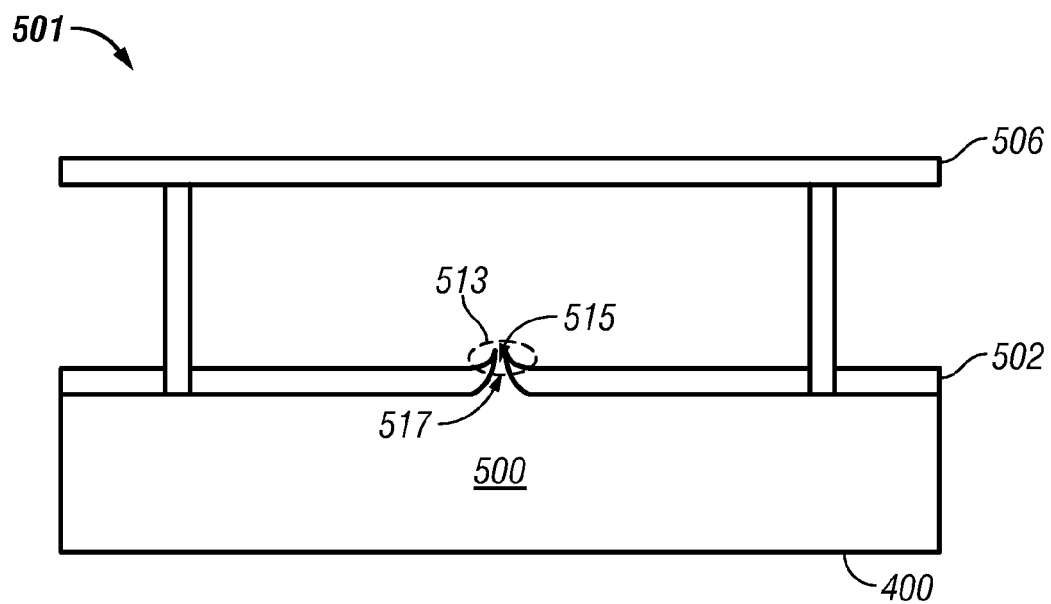

As shown in FIGS. 8E-F, the restoration features 513 may be positioned in various positions, such as a central portion of deformable layer 506 or stationary layer 502. For example, the restoration features 513 may be positioned in the center portion of the deformable layer 506 in some embodiments since the restoration force in the deformed layer 506 may be at a minimum in the center as compared to the restoration force nearer the edges of the deformable layer 506 adjacent the posts 504. The restoration features 513 can be positioned in a variety of locations on the stationary layer 502, or the deformable layer 506, or both.

Figure 8G:
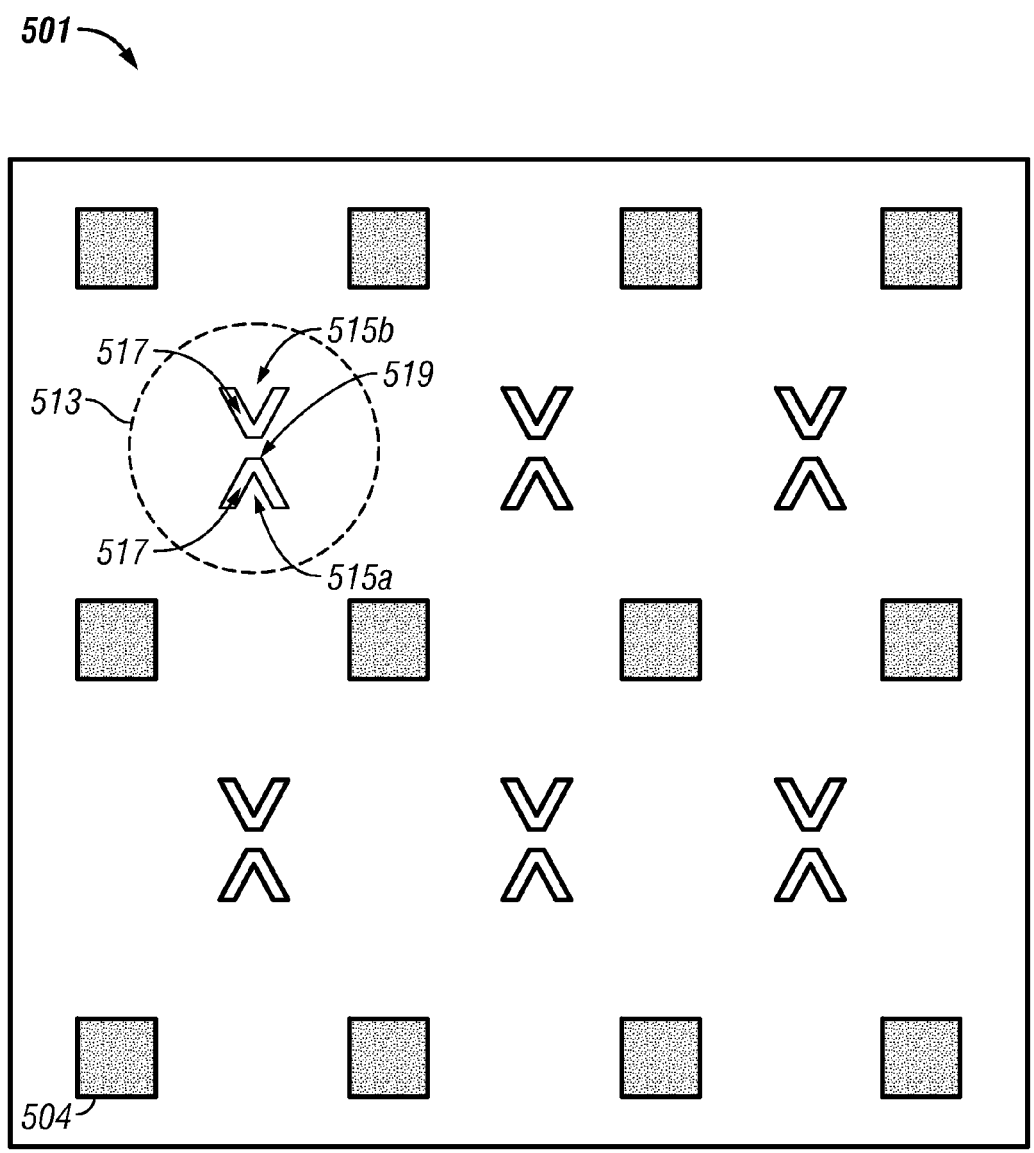
FIGS. 8G-J show top cross-sectional views of various embodiments of the restoration features.
Figure 8H:
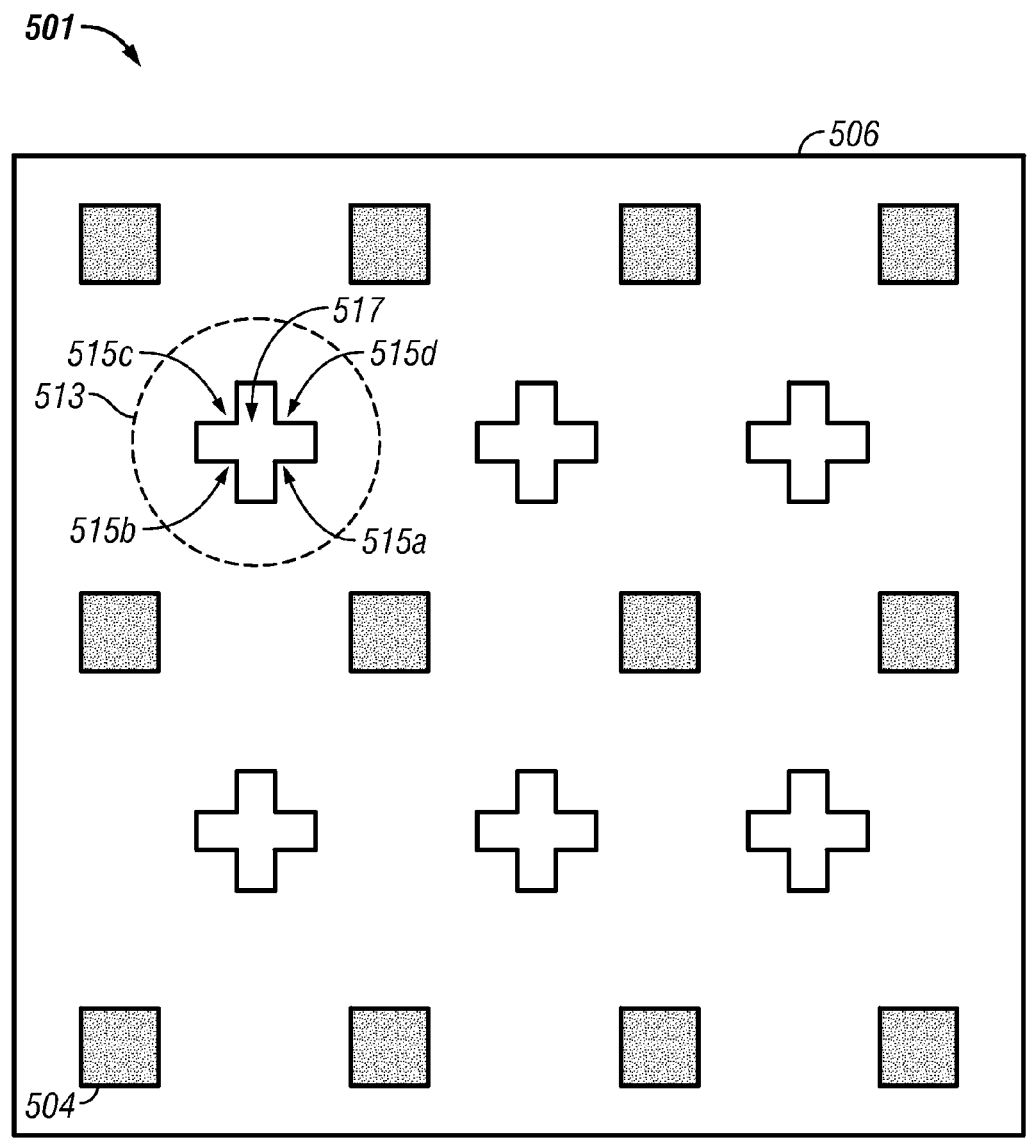
Figure 8I:
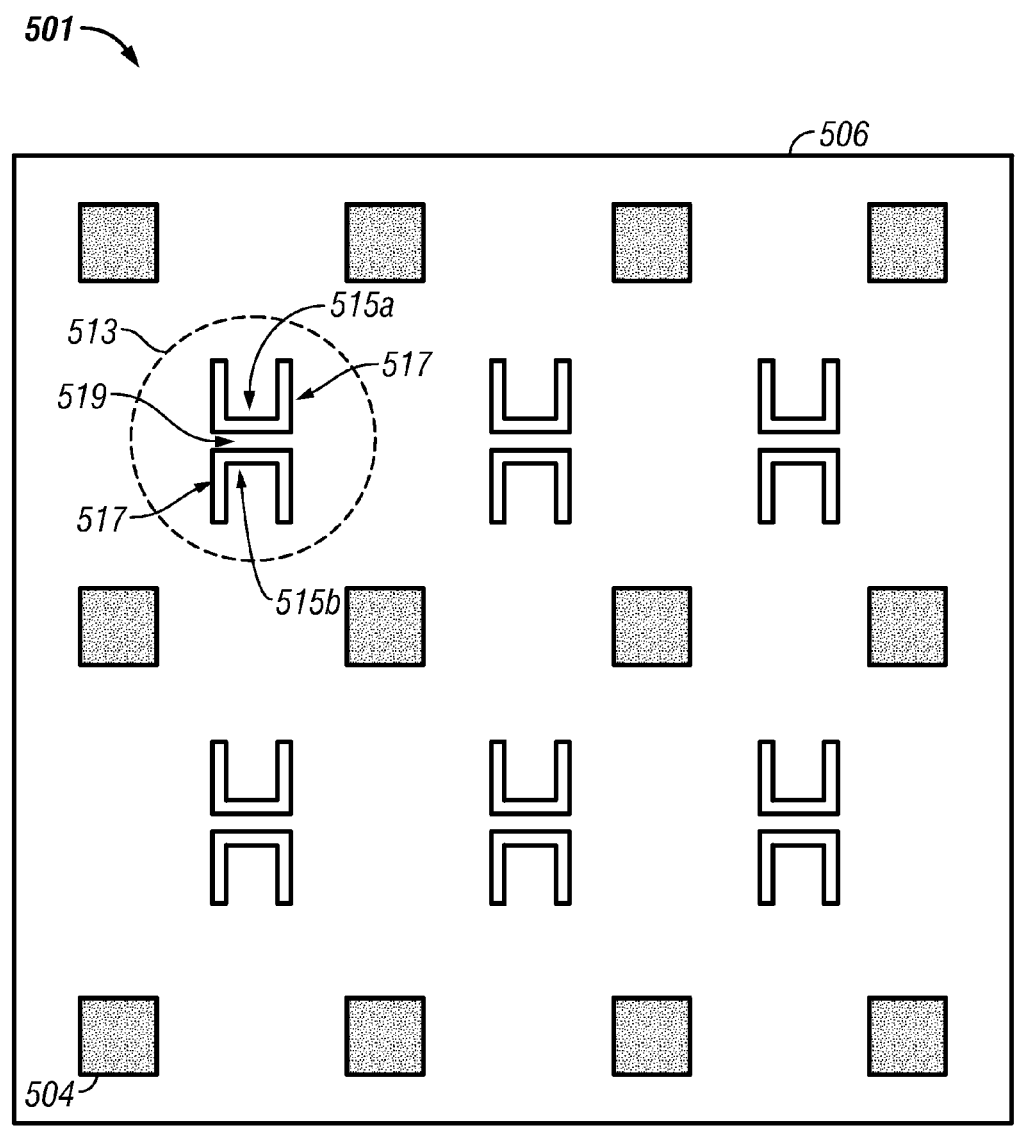
Figure 8J:
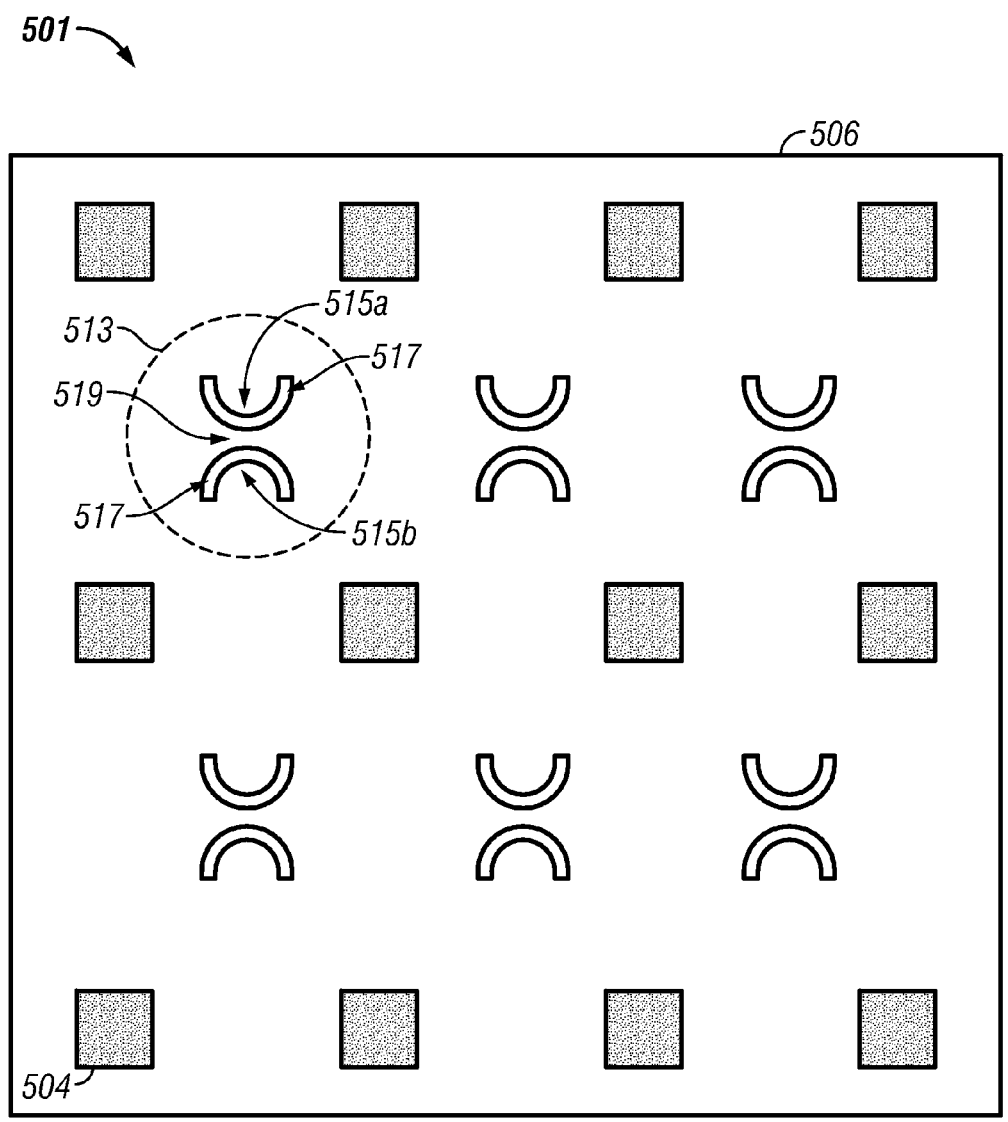
Figure 8K:
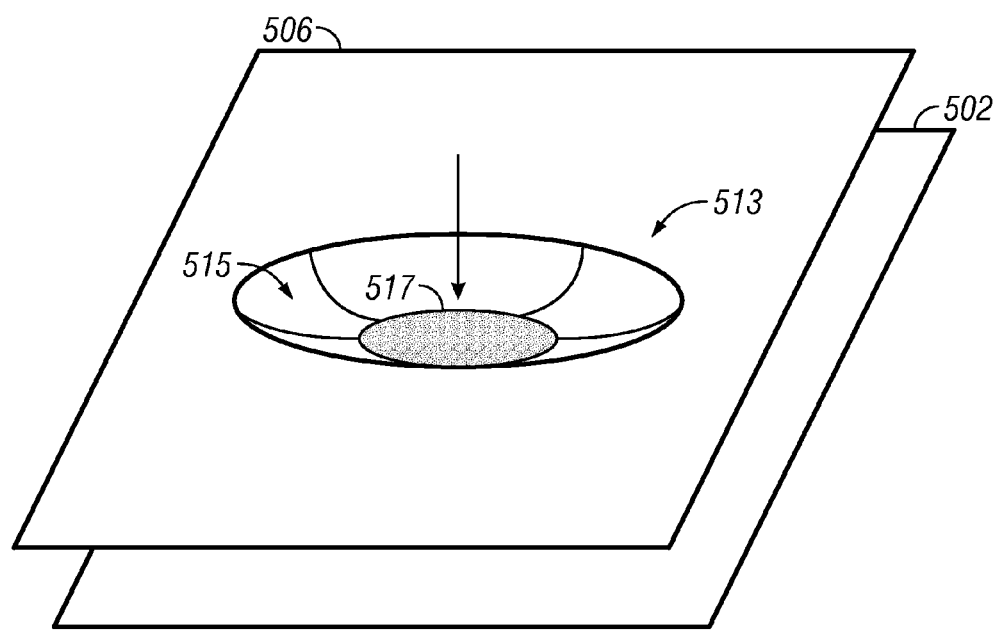
FIG. 8K illustrates a perspective view of a generally circular restoration feature in accordance with certain embodiments described herein.

FIGS. 8G-J show top cross-sectional views of various embodiments of the restoration features 513 and FIG. 8K shows a perspective view of another embodiment. In the illustrated embodiment of FIGS. 8G-J, the restoration features 513 are located generally on the deformable layer 506 between the support posts 504 (only one post 504 is labeled on the figure for clarity) on a portion of the deformable layer 506 which interacts with incident light. For example, as shown in FIG. 8G, the restoration features 513 can be on a central portion of the deformable layer 506 between the support posts 504. Optionally, the restoration features 513 can positioned on other portions of the deformable layer 506 which do not significantly interact with incident light, such that the existence of the restoration features 513 does not affect the optical characteristics of the interferometric modulator 501. For example, the restoration features 513 can be on a peripheral portion of the deformable layer 506 near the support posts 504. In still another embodiment (not illustrated), the restoration features 513 can be positioned on both the central and peripheral portions of the deformable layer 506 with respect to the support posts 504.

The surface of the restoration features 513 may be generally smooth or planar, or the surface of the restoration features 513 may be rough, bumpy or embossed. In certain embodiments, the restoration features 513 may be shaped to maintain a tilt or rounded shape when deflected, and thus, the restoration features 513 in their driven state may not necessarily be flattened. In certain embodiments, the restoration features 513 can be configured to provide a reduced area of contact between the deformable layer 506 and the stationary layer 502.

In certain embodiments, the restoration features 513 can comprise the same materials as either the deformable layer 506 or the stationary layer 502 from which the restoration features 513 are formed. The restoration features 513 can be made from various materials, including, but not limited to, a metal, an alloy, a dielectric material, and an elastomeric material. For example, such materials may include metals including aluminum, semiconductors, oxides of metals or semiconductors, nitrides of metals or semiconductors, and oxynitrides of metals or semiconductors. Restoration features 513 can be any material that substantially do not affect or only insignificantly affect the electrical or optical characteristics of the MEMS device such as interferometric modulator 501. In addition, various masking or color adjustments can be made to areas below and around the restoration features 513 on the stationary layer 502. For example, portions of the stationary layer 502 may be colored or darkened to help compensate for any optical effects of the restoration features 513.

In one embodiment, the restoration features 513 are optically transparent to the light modulated by the interferometric modulator 501. For example, in certain embodiments, in which the restoration features 513 are on the stationary layer 502 of the interferometric modulator 501, the restoration features 513 can be transparent to the light being modulated. Optionally, in the case where the modulated light includes visible light, the transparent material that can be used for the restoration features 513 includes, for example, oxides of metals or semiconductors, nitrides of metals or semiconductors, and oxynitrides of metals or semiconductors. In certain embodiments, the restoration features 513 generally operate like the materials from which it is formed. For example, the restoration features on the deformable layer 506*b* of the interferometric modulator 501 can be reflective to the light being modulated. In certain embodiments in which the optical properties of the restoration features 513 are disruptive or otherwise interfere with the optical performance of the interferometric modulator 501, the restoration features can be configured or sized to have a minimal effect on the operation of the interferometric modulator 501.

In another embodiment, the restoration features 513 may be made of a material that absorbs the light modulated by the interferometric modulator 501. In another embodiment, the restoration features 513 may be covered with such a light absorbing material. Optionally, in the case where the modulated light includes visible light, the light absorbing material that can be used for the restoration features 513 includes, for example, polymeric materials or metals, such as chrome, nickel, titanium, molybdenum, etc.

In still another embodiment, the restoration features 513 may be made of a material that reflects the light modulated by the interferometric modulator 501. The restoration features 513 may be covered with such a light reflecting material. Optionally, in the case where the modulated light includes visible light, the light reflecting material that can be used for the restoration features 513 includes, for example, polymeric materials or metals, such as silver, aluminum, gold, platinum, etc.

Multiple restoration features 513 can be used. Thus, several of the restoration features 513 can be fabricated to provide the landing surfaces of the layers of the interferometric modulator 501. The multiple restoration features 513 may be arranged to be at at least one location in order to minimize a probability of stiction (e.g., between the deformable layer 506 and the stationary layer 502). For example, the restoration features 513 may be spaced as remote as possible from one another on the deformable layer 506 or can be positioned at least a threshold distance from one or more of the support structures between the deformable layer 506 and the stationary layer 502

The restoration features 513 may have any cross-sectional shape. As shown in FIGS. 8G-K, the cross-sectional shape of the restoration features 513 can have one or more shapes, examples of which include but are not limited to: generally semi-triangular, generally semi-chevron-like, generally semi-tabbed-like, generally semi-circular, generally semi-oval, generally semi-rectangular, generally semi-pentagonal, generally X-shaped, and so forth. FIG. 8G shows a top view of a plurality of restoring features 513 generally grouped in pairs in regions of the deformable layer 506 spaced away from the posts 504. The opening 517 (freely movable portion with respect to the deformable layer 506) of each restoring feature 513 is generally semi-chevron-like or V-shaped and the deflecting portions 515*a*, 515*b* restoring features 513 are generally semi-triangular-shaped.

While FIG. 8G shows the openings 517 of the restoring features 513 being separated from one another by a portion 519 of the deformable layer 506, other embodiments have two or more deflecting portions 515 bordering the same opening 517. For example, certain embodiments can have a generally X-shaped opening 517 (e.g., the openings 517 of FIG. 8G without the portions 519) which is bounded by the two deflecting portions 515*a*, 515*b*.

In FIG. 8H, the opening 517 has a generally cross-like shape, and four deflecting portions 515*a*, 515*b*, 515*c*, 515*d* border the opening 517. In FIG. 8I, the restoring features 513 comprise generally U-shaped openings 517 with generally rectangular-shaped deflecting portions 515*a*, 515*b*. In certain other embodiments, the opening 517 can be generally H-shaped, with the two deflecting portions 515*a*, 515*b* bordering the opening 517. As noted, the deflecting portions 515*a*, 515*b* may be configured with different lengths that can span all or part of the gap between the deformable layer 506 and the stationary layer 502. Accordingly, this variation in length of the deflecting portions 515*a*, 515*b* may be useful in configuring the amount of applied force and timing of when these portions apply the force. Such variation in length may be useful for modifying color control of the device and/or modifying actuation and release time of the device during operation.

In FIG. 8J, the openings 517 have a generally curved shaped, and the deflecting portions 515*a*, 515*b* have a curved edge (e.g., are generally semicircular-shaped). In FIG. 8K, the opening 517 has a generally circular shape, and the deflecting portion 515 is a generally circular region of the deformable layer 506 bordering the opening 517. As described more fully below, upon forming the opening 517 through the deformable layer 506, stress gradients in the portion of the deformable layer 506 bordering the opening 517 are curled towards the stationary layer 502, thereby forming the deflecting portion 515.

The restoration features 513 can be fabricated in various configurations and made of various compounds as discussed above, for example, by utilizing the presently existing techniques of depositing and selectively etching a material. For example, the restoration features 513 can also be created from deformations of the layers of the interferometric modulator 301. In another embodiment, the restoration features 513 can be created using conventional semiconductor manufacturing techniques.

The restoration features 513 may be fabricated into one or more components of a MEMS device using various techniques. In general, the restoration features 513 may be fabricated based on a stress gradient configured into at least the portions of the deformable layer 506, which comprise the deflecting portions 515 and/or the stationary layer 502. In some embodiments, the restoration features 513 may be formed by selectively patterning release structures (e.g., holes or slots forming the opening 517) in the deformable layer 506 and/or the stationary layer 502, such that one or more deflecting portions 515 of the restoration feature 513 undergo a deflection having a component in a direction generally away from the layer which contacts the restoration features 513 (e.g., a direction generally perpendicular to the layer in which the restoration feature 513 is formed). Different layers of materials to obtain desired restoration forces and shapes may be employed.

The restoration feature 513 may have benefits beyond mitigating stiction. For example, holes or slots formed in the at least one component (e.g., the deformable layer 506) to create the restoration feature 513 can provide a conduit for etchant and the removal of a sacrificial layer during fabrication. An embodiment of a processing flow for a MEMS device will now be described with reference to FIGS. 9A-9H.

Semiconductor manufacturing techniques may be used in the fabrication processes, such as photolithography, deposition, masking, etching (e.g., dry methods such as plasma etch and wet methods), etc. Deposition includes dry methods such as chemical vapor deposition (CVD, including plasma-enhanced CVD and thermal CVD) and sputter coating, and wet methods such as spin coating.

Figure 9A:
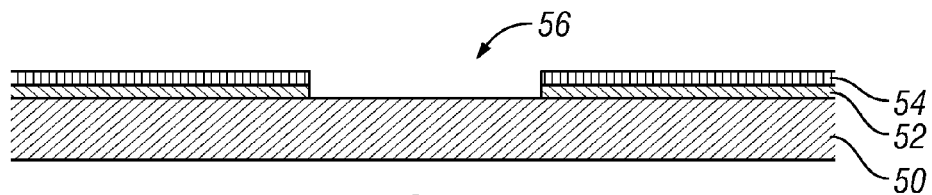
FIGS. 9A-H are schematic cross-sections depicting certain steps in the fabrication of an array of MEMS devices.

In one embodiment, a method of manufacturing an interferometric modulator, such as those described above, is described with respect to FIGS. 9A-9H. In FIG. 9A, an electrode layer 52 has been deposited on a substrate 50 and a partially reflective layer 54 has been deposited over the electrode layer 52. The partially reflective layer 54 and the electrode layer 52 are then patterned and etched to form gaps 56 which may define strip electrodes formed from the electrode layer 52. In addition, the gap 56 may comprise, as it does in the illustrated embodiment, an area in which the electrode layer 52 and the partially reflective layer 54 have been removed from underneath the location where a support structure will be formed. In other embodiments, the partially reflective layer 54 and the electrode layer 52 are only patterned and etched to form the strip electrodes, and the partially reflective layer 54 and electrode layer 52 may thus extend underneath some or all of the support structures. In one embodiment, the electrode layer 52 comprises indium-tin-oxide (ITO). In one embodiment, the partially reflective layer 54 comprises a layer of chromium (Cr). In other embodiments, the placement of the layers 52 and 54 may be reversed, such that the partially reflective layer 54 is located underneath the electrode layer 52. In another embodiment, a single layer (not shown) may serve as both the electrode layer and the partially reflective layer. In other embodiments, only one of the electrode layer 52 or the partially reflective layer 54 may be fowled.

Figure 9B:
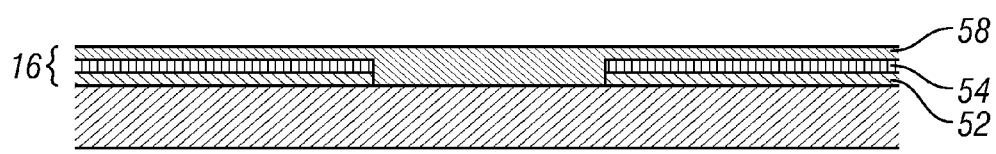

In FIG. 9B, a dielectric layer 58 has been deposited over the patterned electrode layer 52 and partially reflective layer 54. In one embodiment, the dielectric layer 58 may comprise $SiO_2$. In further embodiments, one or more etch stop layers (not shown) may be deposited over the dielectric layer. These etch stop layers may protect the dielectric layer during the patterning of overlying layers. In one embodiment, a etch stop layer comprising $Al_2O_3$ may be deposited over the dielectric layer 58. In a further embodiment, an additional layer of $SiO_2$ may be deposited over the etch stop layer.

Figure 9C:
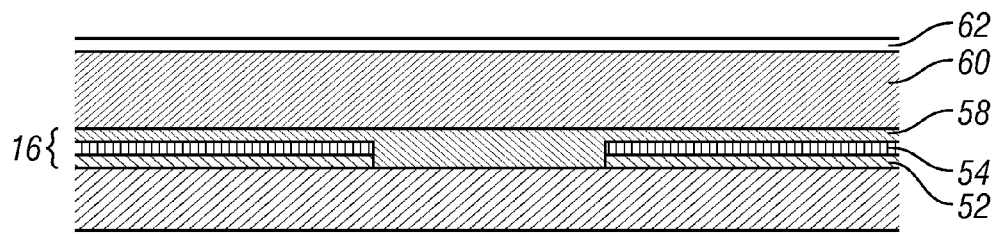

In FIG. 9C, a sacrificial layer 60 has been deposited over the dielectric layer 58. In one embodiment, the sacrificial layer 60 comprises molybdenum (Mo) or silicon (Si), but other materials may be appropriate. Advantageously, the sacrificial layer 60 is selectively etchable with respect to the layers surrounding the sacrificial layer 60. A movable layer 62, in the illustrated embodiment of FIG. 9C, taking the faun of a reflective layer 62, has been deposited over the sacrificial layer 60 and is configured to be movable relative to the partially reflective layer 54 once the sacrificial layer 60 is removed. In certain embodiments, this movable layer will comprise a conductive material. In the illustrated embodiment, unlike the partially reflective layer 54, the layer 62 need not transmit any light through the layer, and thus advantageously comprises a material with high reflectivity. In one embodiment, the layer 62 comprises aluminum (Al), as aluminum has both very high reflectivity and acceptable mechanical properties. In other embodiments, reflective materials such as silver and gold may be used in the layer 62. In further embodiments, particularly in non-optical MEMS devices in which the layer 62 need not be reflective, other materials, such as nickel and copper may be used in the layer 62.

Figure 9D:
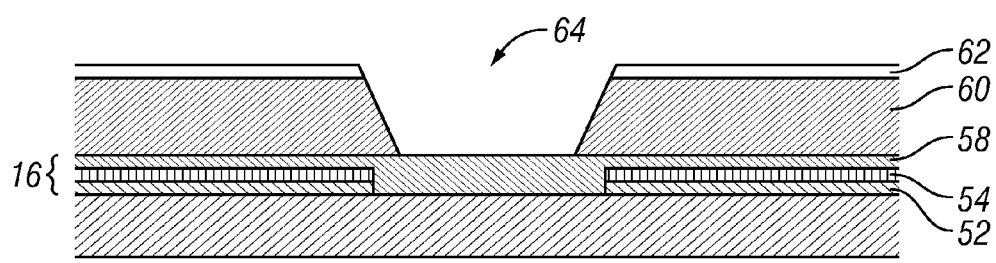

In FIG. 9D, the sacrificial layer 60 and the layer 62 have been patterned and etched to form apertures 64 which extend through the sacrificial layer 62 and reflective layer 60. In the illustrated embodiment, these apertures 64 are preferably tapered to facilitate continuous and conformal deposition of overlying layers.

Figure 9E:
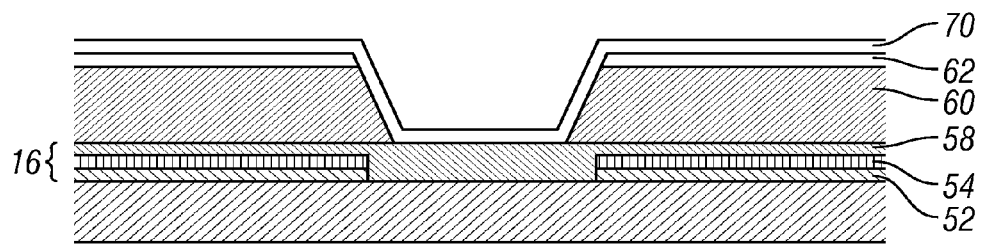

With respect to FIG. 9E, a layer 70 can be deposited over the patterned layer 62 and sacrificial layer 60. This layer 70 may be used to form support posts located throughout an array of MEMS devices. In embodiments in which the MEMS devices being fabricated comprise interferometric modulator elements (such as modulator elements 12a and 12b of FIG. 1), some of the support posts (such as the support structures 18 of FIG. 1) will be located at the edges of the upper movable electrodes (such as the movable reflective layer 14 of FIG. 1) of those interferometric modulator elements. In addition, these support posts may also be formed in the interior of the resulting interferometric modulator elements, away from the edges of the upper movable electrode, such that they support a central or interior section of the upper movable electrode.

Figure 9F:
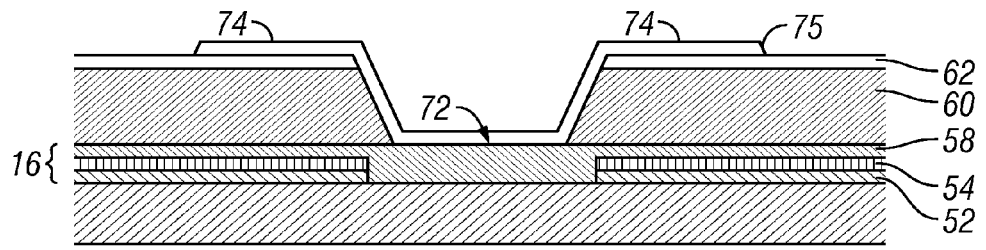

In FIG. 9F, the post layer 70 has been patterned and etched to form a post structure 72. In addition, the illustrated post structure 72 has a peripheral portion which extends horizontally over the underlying layers; this horizontally-extending peripheral portion will be referred to herein as a wing portion 74. As with the patterning and etching of the sacrificial layer 60, the edges 75 of the post structure 72 are preferably tapered or beveled in order to facilitate deposition of overlying layers.

Because the layer 62 was deposited prior to the deposition of the post layer 70, the layer 62 may serve as an etch stop during the etching process used to form the post structure 72, as the portion of the post structure being etched is isolated from the underlying sacrificial layer 60 by the layer 62, even though other portions of the post layer 70 are in contact with the sacrificial layer 60. Thus, an etch process can be used to form the post structures 72 which would otherwise etch the sacrificial layer 60, as well.

Variations to the above process may be made, as well. In one embodiment, the layer 62 may be deposited after the patterning and etching of the sacrificial layer 60, such that the post layer 70 may be completely isolated from the sacrificial layer 60, even along the sloped sidewalls of the apertures in the sacrificial layer 60. Such an embodiment provides an etch stop protecting the post structure 72 during the release etch to remove the sacrificial layer 60. In another embodiment, the post layer 70 may be deposited over a patterned sacrificial layer 60 prior to the deposition of the layer 62. Such an embodiment may be used if the sacrificial layer 60 will not be excessively consumed during the etching of the post structure 72, even without an etch stop.

Figure 9G:
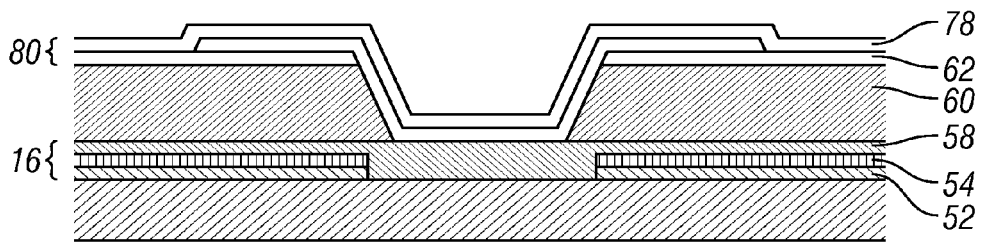

In FIG. 9G, a mechanical layer 78 has been deposited over the post structures 72 and the exposed portions of the layer 62. In certain embodiments, in which the layer 62 provides the reflective portion of the interferometric modulator element, the mechanical layer 78 may advantageously be selected for its mechanical properties, without regard for the reflectivity. In one embodiment, the mechanical layer 78 advantageously comprises nickel (Ni), although various other materials, such as Al, may be suitable. For convenience, the combination of the mechanical layer 78 and the layer 62 may be referred to collectively as the deformable electrode or deformable reflective layer 80.

After deposition of the mechanical layer 78, the mechanical layer 78 is patterned and etched to form desired structures. In particular, the mechanical layer 78 may be patterned and etched to form gaps which define electrodes which are strips of the mechanical layer which are electrically isolated from one another.

The underlying layer 62 may also be patterned and etched to remove the exposed portions of the layer 62. In one embodiment, this may be done via a single patterning and etching process. In other embodiments, two different etches may be performed in succession, although the same mask used to pattern and etch the mechanical layer 78 may be left in place and used to selectively etch the layer 62. In one particular embodiment, in which the mechanical layer 78 comprises Ni and the layer 62 comprises Al, the Ni may be etched by a Nickel Etch (which generally comprise nitric acid, along with other components), and the Al may be etched by either a phosphoric/acetic acid etch or a PAN (phosphoric/acetic/nitric acid) etch. A PAN etch may be used to etch Al in this embodiment, even though it may etch the underlying sacrificial layer 60 as well, because the deformable reflective layer 80 has already been formed over the sacrificial layer 60, and the desired spacing between the deformable reflective layer 80 and underlying layers has thus been obtained. Any extra etching of the sacrificial layer 60 during this etch will not have a detrimental effect on the finished interferometric modulator.

Figure 9H:
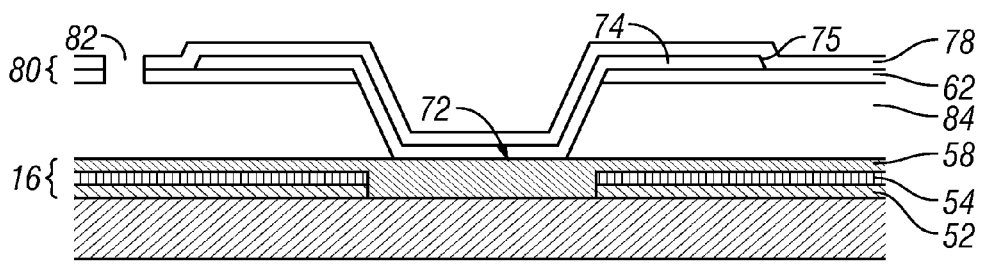

In FIG. 9H, it can be seen that the deformable electrode or reflective layer 80, which comprises the mechanical layer 78 and the layer 62, has also been patterned and etched to form etch holes 82. A release etch is then performed to selectively remove the sacrificial layer 60, forming a cavity 84 which permits the deformable reflective layer 80 to deform toward the electrode layer 52 upon application of appropriate voltage. In one embodiment, the release etch comprises a $XeF_2$ etch, which will selectively remove sacrificial materials like Mo, W, or polysilicon without significantly attacking surrounding materials such as Al, $SiO_2$, Ni, or $Al_2O_3$. The etch holes 82, along with the gaps between the strip electrodes formed from the mechanical layer 78, advantageously permit exposure of the sacrificial layer 60 to the release etch.

As noted above, restoration features 513 can be fabricated by patterning etch holes 82 into suitable shapes and dimensions to form openings 517 and deflecting portions 515, such as those shown in FIGS. 8A-8K. Thus, in some embodiments, the restoration features may be etched into the mechanical layer 78 and the etched portion of the mechanical layer 78 can serve as etch holes that are used in this fabrication process as part of the release etch.

The above-described modifications can help remove process variability and lead to a more robust design and fabrication. Additionally, while the above aspects have been described in terms of selected embodiments of the interferometric modulator, one of skill in the art will appreciate that many different embodiments of interferometric modulators may benefit from the above aspects. Of course, as will be appreciated by one of skill in the art, additional alternative embodiments of the interferometric modulator can also be employed. The various layers of interferometric modulators can be made from a wide variety of conductive and non-conductive materials that are generally well known in the art of semi-conductor and electro-mechanical device fabrication.

Referring now to FIGS. 10A-D, these figures illustrate exemplary simulation models of the restoration features 513 and deformable layer 506. In the simulations shown, a quarter model of the restoration features 513 and deformable layer 506 was used due to the symmetry of a pixel. In the examples shown, the restoration feature 513 has been modeled as an cross shaped or X-shaped feature (e.g., similar to that shown in FIGS. 8G and 8H) having legs that are approximately 6 microns long and the openings 517 may be approximately 2 microns in width.

Figure 10A:
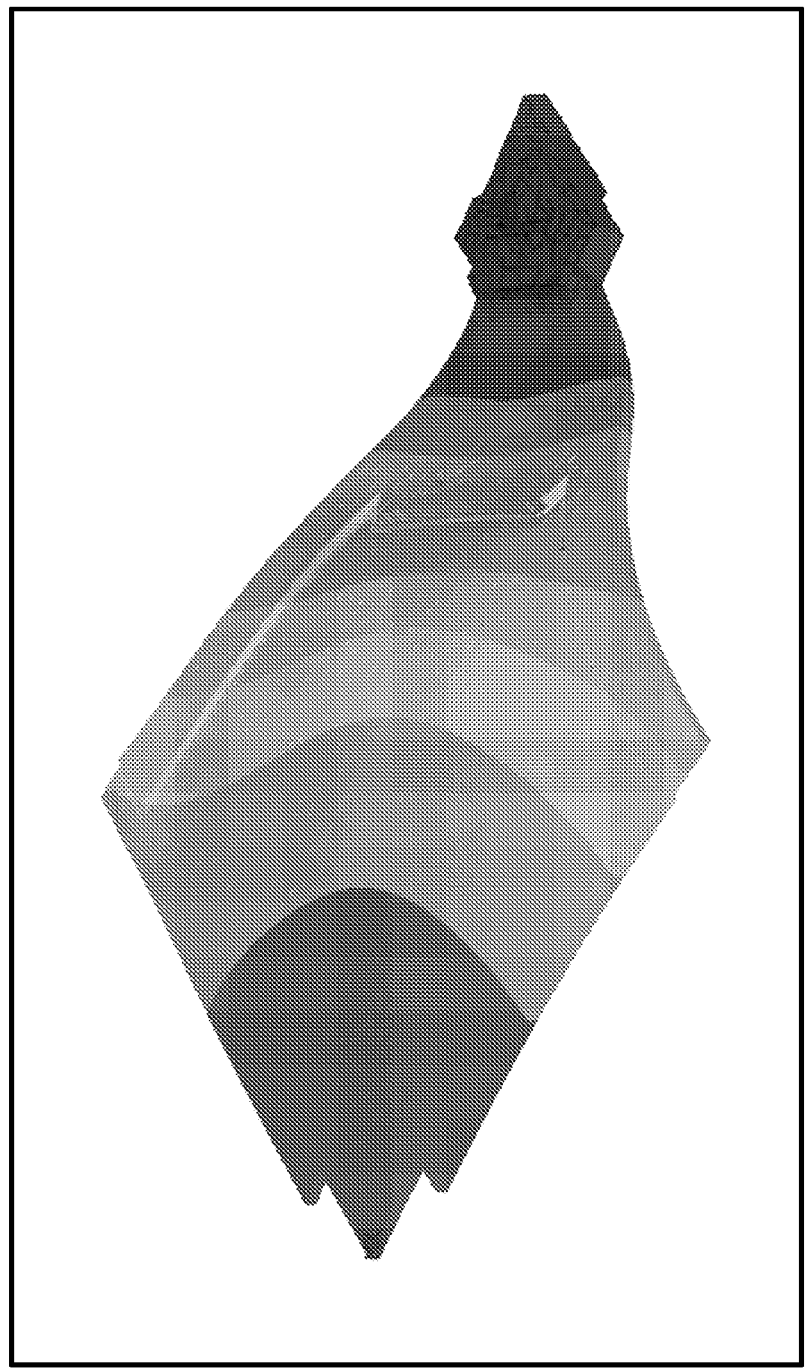
FIGS. 10A-D show exemplary simulation models of a portion of the restoration features in the driven and undriven state.
Figure 10B:
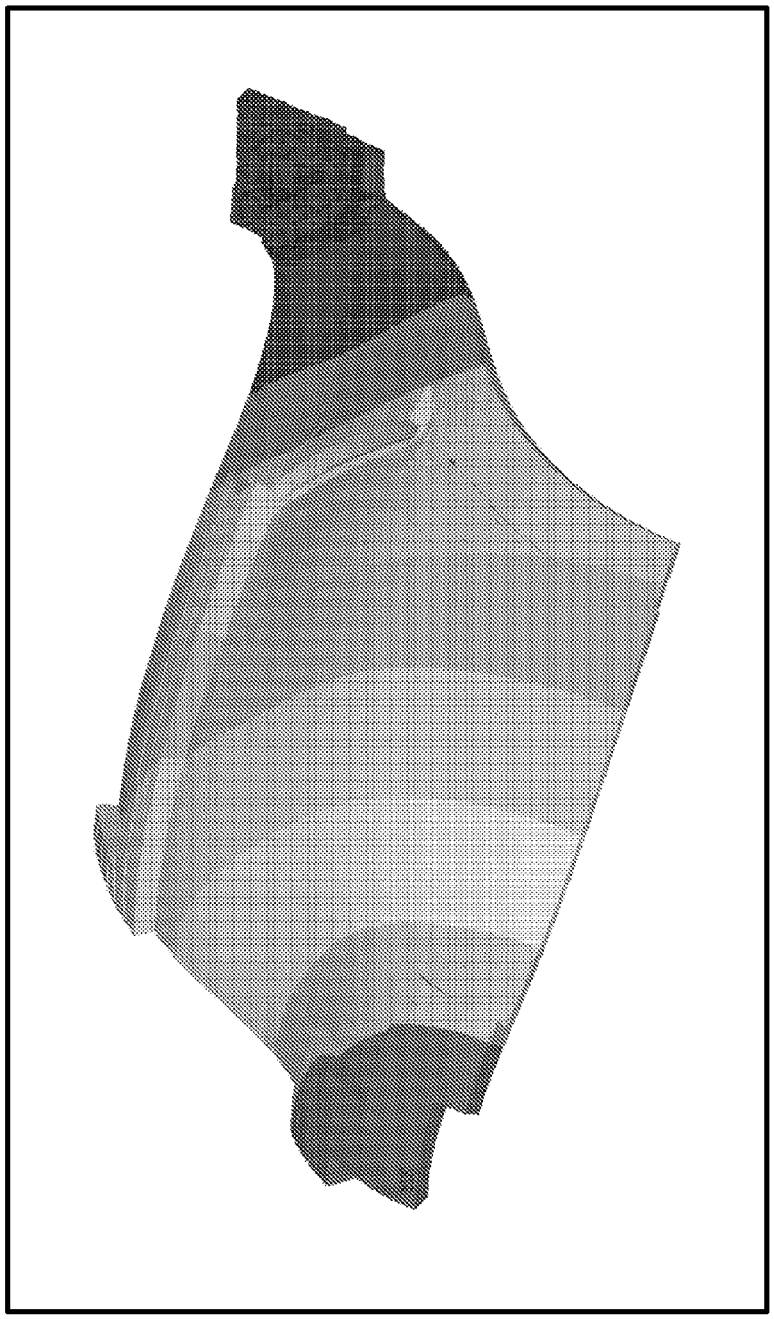

In FIGS. 10A-10B, a quarter of the restoration feature 513 is shown in its undriven, unactuated state. To help illustrate the deflection of the restoration feature 513 in its undriven state, FIGS. 10A-10B are shaded to indicate different vertical heights of portions of the restoration feature 513. In FIG. 10A, the simulation assumed that the deformable layer 506 did not include a secondary local layer around the restoration feature 513. In FIG. 10B, the simulation assumed that the deformable layer 506 included a secondary local layer, such as an oxide, patterned concentrically around the restoration feature 513 thus causing the restoration feature 513 to deform or deflect further in its undriven or unactuated state in comparison to the simulation shown in FIG. 10A.

Figure 10C:
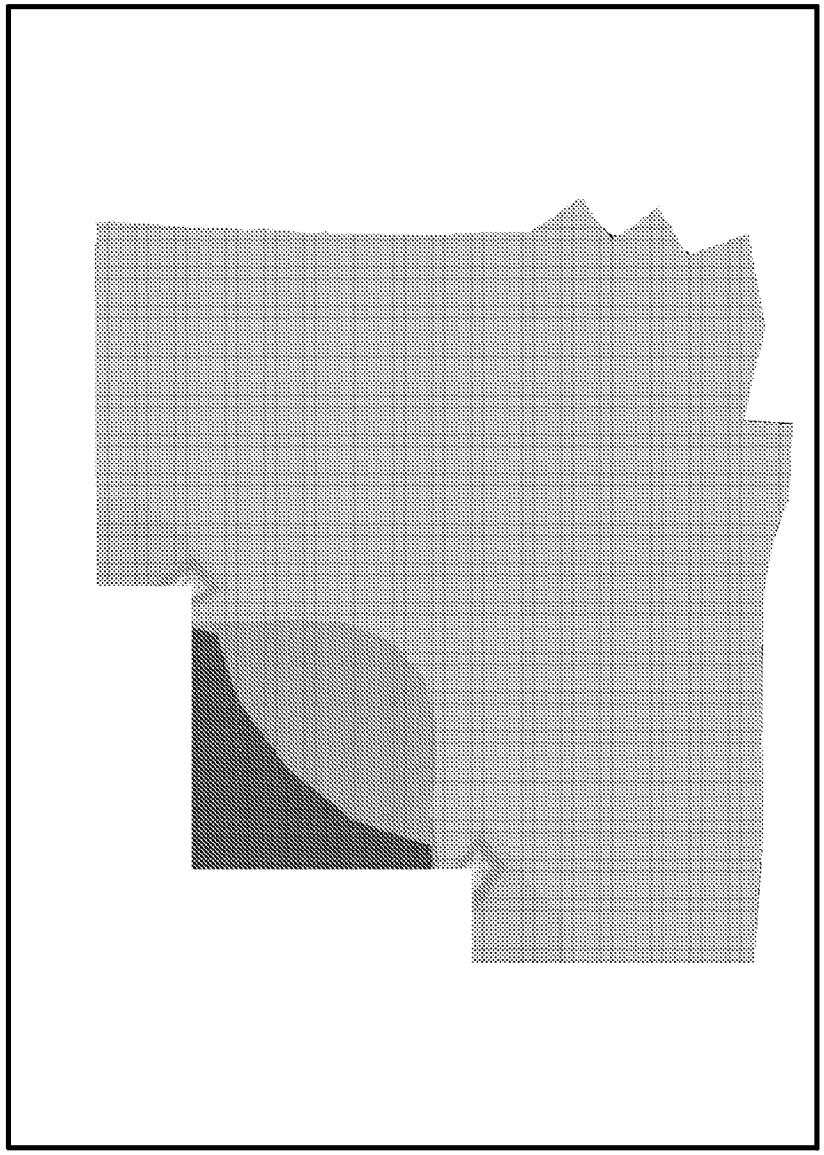
Figure 10D:
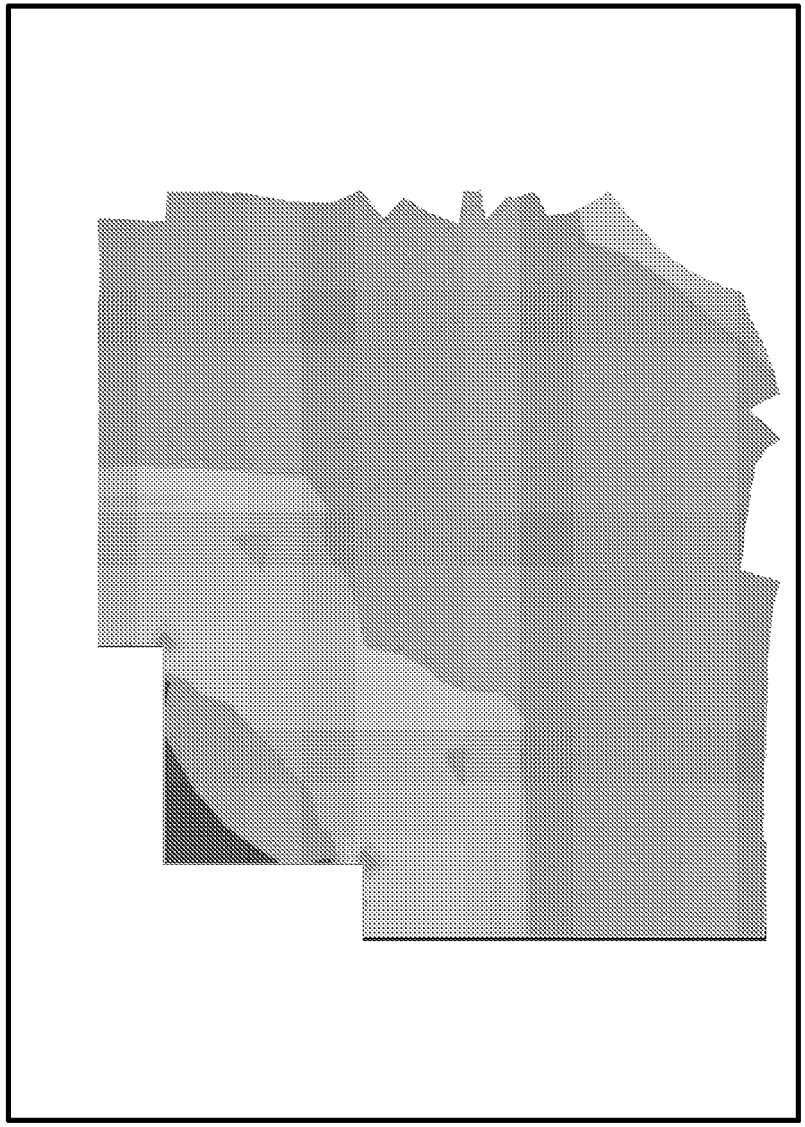

In FIGS. 10C-10D, the quarter of the restoration is shown in its driven or actuated state. As noted, under actuation, strain energy is induced in the restoration features 513. The magnitude of strain energy is indicated in FIGS. 10C-10D by differences in shading. The strain energy is stored in the restoration feature 513 and is released when the $V_{bias}$ voltage applied to the pixel is reduced. When released, the strain energy may thus aid in the restoration of the deformable layer 506 and the restoration feature 513 to the unactuated or undriven state. Accordingly, in some embodiments, it may be desirable to maximize the strain energy in certain areas of the deformable layer 506 and the restoration feature 513 to increase the restoring force that is applied.

FIG. 10C shows the deformable layer 506 and the restoration feature 513 from FIG. 10A, but in the actuated or driven state. FIG. 10D, shows the deformable layer 506 and the restoration feature 513 from FIG. 10B, but in the actuated or driven state. As shown in FIG. 10D, the addition of a secondary oxide layer may enhance the effect of the restoration feature, since the deformation of the restoration feature is larger, thus resulting in higher strain energy being stored. These models are merely exemplary, and other configurations are within embodiments of the present disclosure.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. As will be recognized, the present invention may be embodied within a form that does not provide all of the features and benefits set forth herein, as some features may be used or practiced separately from others.

What is claimed is:

1. A micro-electromechanical (MEMS) device, said device comprising:
   a first component;
   a second component movable relative to the first component in a first direction; and
   at least one restoration feature, on the second component, that applies a restoring force to the second component in a second direction opposite to the first direction and comprises at least one deflecting portion that borders an opening through the second component and extends towards the first component when the first and second components are apart from each other.

2. The MEMS device of claim 1, wherein the at least one deflecting portion comprises a cantilever.

3. The MEMS device of claim 2, wherein the cantilever curls toward the first component when the second component and the first component are apart from one another.

4. The MEMS device of claim 1, wherein the at least one deflecting portion comprises a plurality of leaves that extend towards the first component.

5. The MEMS device of claim 4, wherein the plurality of leaves curl toward the first component when the second component and the first component are apart from one another.

6. The MEMS device of claim 1, wherein the opening through the second component comprises a generally chevron-like shape.

7. The MEMS device of claim 1, wherein the opening through the second component comprises a generally cross-like shape.

8. The MEMS device of claim 1, wherein the at least one deflecting portion comprises a generally rectangular shape.

9. The MEMS device of claim 1, wherein the at least one deflecting portion has a curved edge.

10. The MEMS device of claim 1, further comprising at least one restoration feature, on the first component, that applies a second restoring force to the second component in the second direction.

11. The MEMS device of claim 1, wherein the at least one restoration feature comprises a plurality of restoration features on the second component.

12. The MEMS device of claim 1, wherein the at least one restoration feature is at least one location that minimizes a probability of stiction between the first and second component.

13. The MEMS device of claim 1, wherein the MEMS device is an interferometric modulator.

14. The MEMS device of claim 13, wherein the first component comprises a substrate having a partially reflective layer and the second component comprises a reflective layer.

15. The MEMS device of claim 14, wherein the reflective layer is deformable to move in the first direction.

16. The MEMS device of claim 14, wherein the second component further comprises a deformable layer coupled to the reflective layer, the deformable layer configured to move in the first direction.

17. The MEMS device of claim 1, wherein the opening comprises an etch hole through the second component.

18. The MEMS device of claim 1, wherein the second component is coupled to the first component by one or more support structures and wherein the at least one restoration feature is positioned on the second component at least a threshold distance from the one or more support structures.

19. The MEMS device of claim 1, further comprising:
   a display;
   a processor that is configured to communicate with the display, the processor being configured to process image data; and
   a memory device that is configured to communicate with the processor.

20. The MEMS device of claim 19, further comprising a driver circuit configured to send at least one signal to the display.

21. The MEMS device of claim 20, further comprising a controller configured to send at least a portion of the image data to the driver circuit.

22. The MEMS device of claim 19, further comprising an image source module configured to send the image data to the processor.

23. The MEMS device of claim 22, wherein the image source module comprises at least one of a receiver, transceiver, and transmitter.

24. The MEMS device of claim 19, further comprising an input device configured to receive input data and to communicate the input data to the processor.

25. The MEMS device of claim 1, wherein the at least one restoration feature is placed to minimize stiction between the second component and other portions of the MEMS device.

26. A micro-electromechanical (MEMS) apparatus comprising:
   means for partially reflecting light;
   means for reflecting light, wherein the reflecting means is movable in a first direction relative to the partially reflecting means; and
   means for applying a restoring force to the reflecting means, the restoring means on the reflecting means, the restoring force in a second direction opposite to the first direction, the restoring means bordering an opening through the reflecting means and extending towards the partially reflecting means when the partially reflecting means and the reflecting means are apart from each other.

27. The MEMS apparatus of claim 26, wherein the partially reflecting means comprises a substrate.

28. The MEMS apparatus of claim 26, wherein the reflecting means comprises a reflective layer.

29. The MEMS apparatus of claim 26, wherein the restoring means comprises a cantilever that curls towards the partially reflecting means.

30. The MEMS apparatus of claim 26, wherein the restoring means comprises a plurality of cantilevers that curl towards the partially reflecting means.

31. The MEMS apparatus of claim 26, wherein the restoring means minimizes stiction between the partially reflecting means and the reflecting means.

* * * * *